(12) United States Patent
Inada

(10) Patent No.: US 11,924,403 B2
(45) Date of Patent: Mar. 5, 2024

(54) IMAGING ELEMENT AND ELECTRONIC DEVICE

(71) Applicant: SONY SEMICONDUCTOR SOLUTIONS CORPORATION, Kanagawa (JP)

(72) Inventor: Yoshiaki Inada, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 568 days.

(21) Appl. No.: 17/250,184

(22) PCT Filed: May 14, 2019

(86) PCT No.: PCT/JP2019/019101
§ 371 (c)(1),
(2) Date: Dec. 10, 2020

(87) PCT Pub. No.: WO2019/244514
PCT Pub. Date: Dec. 26, 2019

(65) Prior Publication Data
US 2021/0176458 A1    Jun. 10, 2021

(30) Foreign Application Priority Data

Jun. 19, 2018  (JP) .................................. 2018-115933

(51) Int. Cl.
*H04N 17/00* (2006.01)
*H01L 27/146* (2006.01)
(Continued)

(52) U.S. Cl.
CPC ..... *H04N 17/002* (2013.01); *H01L 27/14634* (2013.01); *H01L 27/14636* (2013.01);
(Continued)

(58) Field of Classification Search
CPC ...... H04N 17/002; H04N 25/76; H04N 25/79; H01L 27/14634; H01L 27/14636;
(Continued)

(56) References Cited

U.S. PATENT DOCUMENTS

2010/0245647 A1  9/2010 Honda et al.
2012/0008410 A1  1/2012 Huynh
(Continued)

FOREIGN PATENT DOCUMENTS

CN    101848344 A   9/2010
CN    205160709 U   4/2016
(Continued)

OTHER PUBLICATIONS

International Search Report and Written Opinion of PCT Application No. PCT/JP2019/019101, dated Jul. 30, 2019, 07 pages of ISRWO.

*Primary Examiner* — Michael E Teitelbaum
(74) *Attorney, Agent, or Firm* — CHIP LAW GROUP

(57) ABSTRACT

An imaging element of the present disclosure includes a first substrate on which a pixel circuit connected to a light receiving part is formed and a second substrate on which a pixel control part that controls the pixel circuit is formed, the first substrate and the second substrate being stacked. Then, the first substrate includes a first wiring formed corresponding to a first pixel row or pixel column, a second wiring formed corresponding to a second pixel row or pixel column, a first connection part that connects the first wiring and the pixel control part, a second connection part that connects the second wiring and the pixel control part, a switch part that controls connection between the first wiring and the second wiring, a first electrode connected to the first wiring via the switch part, and a second electrode connected to the second wiring via the switch part.

11 Claims, 14 Drawing Sheets

(51) Int. Cl.
*H04N 25/76* (2023.01)
*H04N 25/79* (2023.01)

(52) U.S. Cl.
CPC ....... *H01L 27/14645* (2013.01); *H04N 25/76* (2023.01); *H04N 25/79* (2023.01)

(58) Field of Classification Search
CPC ......... H01L 27/14645; H01L 27/14621; H01L 27/14612
See application file for complete search history.

(56) References Cited

U.S. PATENT DOCUMENTS

2016/0014363 A1* 1/2016 Kito ................. H04N 25/617
348/308
2018/0217665 A1* 8/2018 Konstantatos ........ G06F 3/0304

FOREIGN PATENT DOCUMENTS

| | | |
|---|---|---|
| CN | 107534049 A | 1/2018 |
| EP | 2234387 A1 | 9/2010 |
| JP | 2007-248502 A | 9/2007 |
| JP | 2010-225927 A | 10/2010 |
| JP | 2015-165544 A | 9/2015 |
| KR | 10-2010-0106920 A | 10/2010 |
| TW | 201423128 A | 6/2014 |

\* cited by examiner

TO ANALOG-DIGITAL CONVERSION PART

IMAGING ELEMENT AND ELECTRONIC DEVICE

CROSS REFERENCE TO RELATED APPLICATIONS

This application is a U.S. National Phase of International Patent Application No. PCT/JP2019/019101 filed on May 14, 2019, which claims priority benefit of Japanese Patent Application No. JP 2018-115933 filed in the Japan Patent Office on Jun. 19, 2018. Each of the above-referenced applications is hereby incorporated herein by reference in its entirety.

TECHNICAL FIELD

The present disclosure relates to an imaging element and an electronic device.

BACKGROUND ART

There is a light receiving chip on which an inspection can be performed for light receiving elements arranged in a matrix on a semiconductor substrate even in a state before a perforated electrode for light receiving signal output is formed (for example, see Patent Document 1).

In the light receiving chip disclosed in Patent Document 1, a plurality of light receiving elements is divided into several element groups, and an inspection pad is provided corresponding to each element group. Then, each element group is connected to a common inspection signal line, both an output circuit and an input circuit are connected to each inspection pad, and the inspection signal line is connected to the output circuit or the input circuit of the corresponding inspection pad by a changeover switch, so that the light receiving element can be inspected using the inspection pad.

CITATION LIST

Patent Document

Patent Document 1: Japanese Patent Application Laid-Open No. 2015-165544

SUMMARY OF THE INVENTION

Problems to be Solved by the Invention

The light receiving chip disclosed in Patent Document 1 described above is designed for the purpose of inspecting a light receiving element in a state before a perforated electrode for outputting a light receiving signal is formed.

An object of the present disclosure is to provide an imaging element on which inspection can be performed for a wiring formed in each pixel row or each pixel column with a minimum number of additional circuits, and an electronic device including the imaging element.

Solutions to Problems

An imaging element of the present disclosure for achieving the object described above includes
a first substrate on which a pixel circuit connected to a light receiving part is formed, and a second substrate on which a pixel control part that controls the pixel circuit is formed, the first substrate and the second substrate being stacked,
in which the first substrate includes
a first wiring formed corresponding to a first pixel row or pixel column,
a second wiring formed corresponding to a second pixel row or pixel column,
a first connection part that connects the first wiring and the pixel control part,
a second connection part that connects the second wiring and the pixel control part,
a switch part that controls connection between the first wiring and the second wiring,
a first electrode connected to the first wiring via the switch part, and
a second electrode connected to the second wiring via the switch part.

Furthermore, an electronic device of the present disclosure for achieving the object described above is characterized by including the imaging element having the above-described configuration.

MODE FOR CARRYING OUT THE INVENTION

Figure 1:
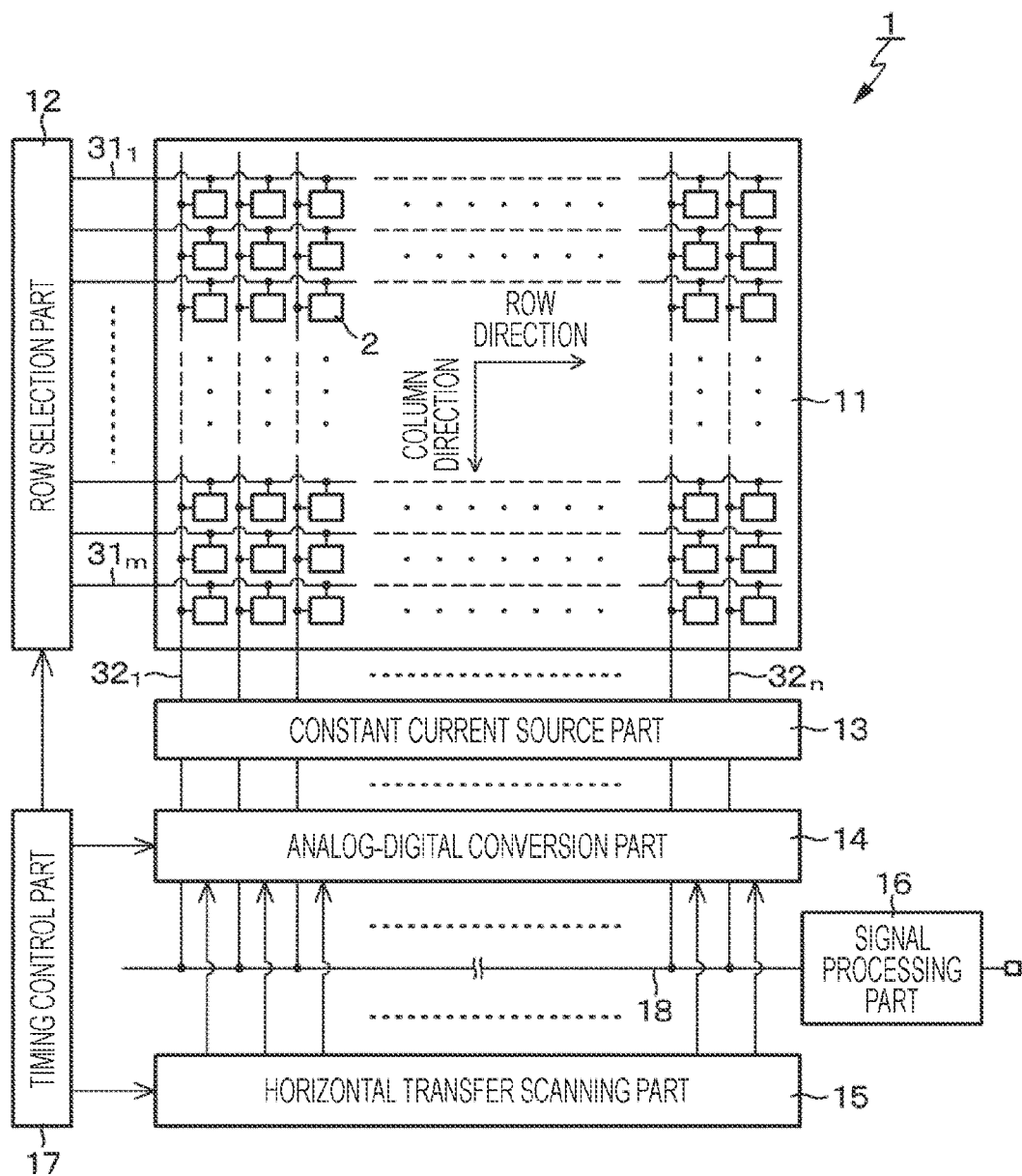
FIG. 1 is a block diagram showing an outline of a basic configuration of a CMOS image sensor which is an example of an imaging element of the present disclosure.

Hereinafter, modes (hereinafter, referred to as "embodiments") for implementing the technology of the present disclosure will be described in detail with reference to the drawings. The technology of the present disclosure is not limited to the embodiments, and various numerical values, materials, and the like in the embodiments are examples. In the following description, the same reference numerals will be used for the same elements or elements having the same function, and redundant description will be omitted. Note that the description will be given in the following order.

1. General explanation of imaging element and electronic device of the present disclosure
2. Imaging element of the present disclosure
   2-1. Configuration example of CMOS image sensor
   2-2. Pixel configuration example
   2-3. Configuration example of analog-digital conversion part
   2-4. Stacked type chip structure
3. Description of embodiments
   3-1. First embodiment (example of opening test)
   3-2. Second embodiment (example of opening/short circuit test)
   3-3. Third embodiment (example of an imaging element wafer having opening/short circuit test function)
4. Modification
5. Electronic device of the present disclosure (example of imaging device)
6. Configuration that the present disclosure can take General Explanation of Imaging Element and Electronic Device of the Present Disclosure An imaging element and an electronic device of the present disclosure can be configured such that a first wiring and a second wiring are provided for each pixel row, each column row, or each pixel row and each column row of pixel arrangement in a matrix. Furthermore, a configuration can be adopted in which, in a switch part, the first wiring and the second wiring are connected in series between a first electrode and a second electrode.

The imaging element and the electronic device of the present disclosure including the above-described preferable configuration can be configured such that there is a plurality of wirings between the first wiring and the second wiring, and in the switch part, the first wiring, the plurality of wirings, and the second wiring are connected in series between the first electrode and the second electrode.

Furthermore, the imaging element and the electronic device of the present disclosure including the above-described preferable configuration can be configured such that, in between the first electrode and the second electrode, inspection for presence or absence of broken of the first wiring, the plurality of wirings, and the second wiring can be performed. Alternatively, a configuration can be adopted in which, in between the first electrode and the second electrode, inspection for the quality of a transistor included in a pixel can be performed.

Furthermore, the imaging element and the electronic device of the present disclosure including the above-described preferable configuration can be configured such that two first electrodes and two second electrodes are provided. At this time, a configuration can be adopted in which, in the switch part, the first wiring, the plurality of wirings, and the second wiring of odd rows/odd columns are connected in series between one of the first electrodes and one of the second electrodes, and the first wiring, the plurality of wirings, and the second wiring of even rows/even columns are connected in series between the other of the first electrodes and the other of the second electrodes.

Moreover, the imaging element and the electronic device of the present disclosure including the above-described preferable configuration can be configured such that inspection for presence or absence of breaking of the wirings of odd rows/odd columns can be performed in between one of the first electrodes and one of the second electrodes, and inspection for presence or absence of breaking of the wirings of even rows/even columns can be performed in between the other of the first electrodes and the other of the second electrodes. Alternatively, a configuration can be adopted in which inspection for presence or absence of a short circuit between adjacent wirings can be performed by checking whether or not a current flows between the wirings connected in series of odd rows/odd columns and the wirings connected in series of even rows/even columns.

Furthermore, the imaging element and the electronic device of the present disclosure including the above-described preferable configuration can be configured such that a switch element included in the switch part includes a transistor having the same conductivity type as that of a transistor included in the pixel.

Imaging Element of the Present Disclosure

The basic configuration of the imaging element of the present disclosure to which the technology according to the present disclosure is applied will be described. Here, a complementary metal oxide semiconductor (CMOS) image sensor, which is a type of an X-Y address type imaging element, will be described as an example of the imaging element. The CMOS image sensor is an image sensor manufactured by applying or partially using a CMOS process.

Configuration Example of CMOS Image Sensor

FIG. 1 is a block diagram showing an outline of a basic configuration of a CMOS image sensor which is an example of an imaging element of the present disclosure.

A CMOS image sensor 1 according to this example has a configuration including: a pixel array part 11 having pixels 2 including a light receiving part (photoelectric conversion part) are two-dimensionally arranged in a row direction and a column direction, that is, in a matrix; and a periphery circuit part of the pixel array part 11. Here, the row direction means an array direction of the pixels 2 in a pixel row (so-called horizontal direction), and the column direction means an array direction of the pixels 2 in a pixel column (so-called vertical direction). The pixel 2 generates and accumulates a photocharge corresponding to the amount of received light by performing photoelectric conversion.

The peripheral circuit part of the pixel array part 11 includes, for example, a row selection part 12, a constant current source part 13, an analog-digital conversion part 14, a horizontal transfer scanning part 15, a signal processing part 16, a timing control part 17, and the like.

In the pixel array part 11, control lines $31_1$ to $31_m$ (hereinafter, sometimes collectively referred to as "control line 31") are wired along the row direction for each pixel row in the matrix of pixel arrays. Furthermore, vertical signal lines $32_1$ to $32_n$ (hereinafter, sometimes collectively referred to as "vertical signal line 32") are wired along the column direction for each pixel column. The control line 31 transmits a drive signal for driving when reading a signal from the pixel 2. In FIG. 1, the control line 31 is shown as one wiring. However, the control line 31 is not limited to one. One end of the control line 31 is connected to an output terminal corresponding to each row of the row selection part 12.

Each circuit part of the peripheral circuit part of the pixel array part 11, that is, the row selection part 12, the constant current source part 13, the analog-digital conversion part 14, the horizontal transfer scanning part 15, the signal processing part 16, and the timing control part 17 will be described below.

The row selection part 12 includes a shift register, an address decoder, and the like, and controls the scanning of the pixel row and the address of the pixel row when selecting each pixel 2 of the pixel array part 11. Although the specific configuration of the row selection part 12 is not illustrated, in general, the row selection part 12 has two scanning systems of a reading scanning system and a sweeping scanning system.

In order to read a pixel signal from the pixel 2, the reading scanning system sequentially selects and scans the pixels 2 of the pixel array part 11 in units of rows. The pixel signal read from the pixel 2 is an analog signal. In the sweeping scanning system, sweeping scan is performed ahead of reading scan by amount of time of shutter speed, with respect to a reading row where reading scan is performed by the reading scanning system.

Unnecessary charges are swept out from the photoelectric conversion part of the pixel 2 in the reading row by the sweeping scan by the sweeping scanning system, whereby the photoelectric conversion part is reset. Then, so-called electronic shutter operation is performed by sweeping out (resetting) unnecessary charges by this sweeping scanning system. Here, the electronic shutter operation refers to operation of discarding a photocharge of the photoelectric conversion part and starting new exposure (starting accumulation of a photocharge).

The constant current source part 13 includes a plurality of current sources I each including, for example, a MOS transistor, which is connected to each of the vertical signal lines $32_1$ to $32_n$ for each pixel column, and supplies a bias current to each of the pixels 2 of the pixel row that has been selected and scanned by the row selection part 12, through each of the vertical signal lines $32_1$ to $32_n$.

The analog-digital conversion part 14 includes a set of a plurality of analog-digital converters provided corresponding to the pixel columns of the pixel array part 11, for example, provided for each pixel column. The analog-digital conversion part 14 is a column parallel type analog-digital conversion part that converts an analog pixel signal output through each of the vertical signal lines $32_1$ to $32_n$ into an N-bit digital signal for each pixel column.

As the analog-digital converter in the column parallel analog-digital conversion part 14, for example, a single slope analog-digital converter which is an example of a reference signal comparison type analog-digital converter can be used. However, the analog-digital converter is not limited to the single slope analog-digital converter, and a successive approximation analog-digital converter or a delta-sigma modulation ($\Delta\Sigma$ modulation) analog-digital converter can be used.

The horizontal transfer scanning part 15 includes a shift register, an address decoder, and the like, and controls the scanning of the pixel column and the address of the pixel column when reading the signal of each pixel 2 of the pixel array part 11. Under the control of the horizontal transfer scanning part 15, the pixel signal converted into a digital signal by the analog-digital conversion part 14 is read out to the horizontal transfer line 18 of 2N bit width in units of pixel columns.

The signal processing part 16 performs predetermined signal processing on the digital pixel signal supplied through the horizontal transfer line 18 to generate two-dimensional image data. For example, the signal processing part 16 corrects vertical line defects or point defects, clamps signals, and performs digital signal processing such as parallel-serial conversion, compression, encoding, addition, averaging, and intermittent operation. The signal processing part 16 outputs the generated image data as an output signal of the CMOS image sensor 1 to a device in the subsequent stage.

The timing control part 17 generates various timing signals, clock signals, control signals, and the like, and on the basis of these generated signals, performs drive control of the row selection part 12, the constant current source part 13, the analog-digital conversion part 14, the horizontal transfer scanning part 15, the signal processing part 16, and the like.

Pixel Circuit Configuration Example

Figure 2:
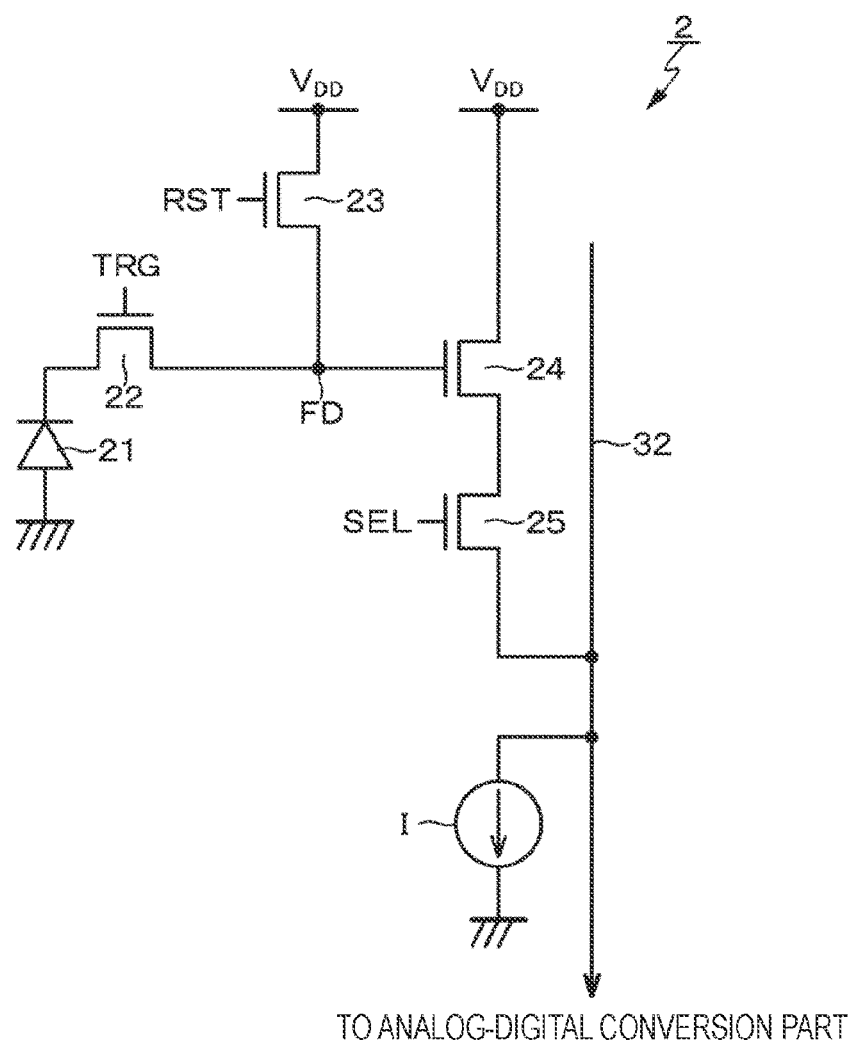
FIG. 2 is a circuit diagram showing an example of a circuit configuration of a pixel.

FIG. 2 is a circuit diagram showing an example of a circuit configuration of the pixel 2. The pixel 2 has, for example, a photodiode 21 as a photoelectric conversion part being a light receiving part. The pixel 2 has a pixel configuration including a transfer transistor 22, a reset transistor 23, an amplification transistor 24, and a selection transistor 25 in addition to the photodiode 21.

As the four transistors of the transfer transistor 22, the reset transistor 23, the amplification transistor 24, and the selection transistor 25, for example, N-channel MOS type field effect transistors (FETs) are used. By configuring the pixel 2 with only N-channel transistors, it is possible to optimize area efficiency and the viewpoint of process reduction. However, the combination of the conductivity types of the four transistors 22 to 25 exemplified here is a merely example, and the combination is not limited thereto.

For the pixel 2, a plurality of control lines is wired in common to each pixel 2 in the same pixel row, as the control line 31 described above. The plurality of control lines is connected to output terminals of the row selection part 12 corresponding to each pixel row in units of pixel rows. The row selection part 12 appropriately outputs a transfer signal TRG, a reset signal RST, and a selection signal SEL to a plurality of control lines.

The photodiode 21 has an anode electrode connected to a low-potential-side power supply (for example, ground), photoelectrically converts received light into a photocharge (here, photoelectron) having a charge amount corresponding to the light amount of the received light, and accumulates the photocharge. A cathode electrode of the photodiode 21 is electrically connected to a gate electrode of the amplification transistor 24 via the transfer transistor 22. Here, a region to which the gate electrode of the amplification transistor 24 is electrically connected is a floating diffusion (floating diffusion region/impurity diffusion region) FD. The floating diffusion FD is a charge-to-voltage conversion part that converts charges into a voltage.

To the gate electrode of the transfer transistor 22, a transfer signal TRG for which a high level (for example, $V_{DD}$ level) becomes active is supplied from the row selection part 12. When the transfer transistor 22 becomes conductive in response to the transfer signal TRG, the transfer transistor 22 transfers the photocharge photoelectrically converted in the photodiode 21 and accumulated in the photodiode 21 to the floating diffusion FD.

The reset transistor 23 is connected between the node of the high-potential-side power supply voltage $V_{DD}$ and the floating diffusion FD. To the gate electrode of the reset transistor 23, a reset signal RST for which a high level becomes active is supplied from the row selection part 12. The reset transistor 23 becomes conductive in response to the reset signal RST, and resets the floating diffusion FD by discarding the charge of the floating diffusion FD to the node of the voltage $V_{DD}$.

The gate electrode of the amplification transistor 24 is connected to the floating diffusion FD, and the drain electrode of the amplification transistor 24 is connected to the node of the high-potential-side power supply voltage $V_{DD}$. The amplification transistor 24 is an input part of a source follower that reads out a signal obtained by photoelectric conversion in the photodiode 21. That is, the source electrode of the amplification transistor 24 is connected to the vertical signal line 32 via the selection transistor 25. Then, the amplification transistor 24 and the current source I connected to one end of the vertical signal line 32 constitute a source follower that converts the voltage of the floating diffusion FD to the potential of the vertical signal line 32.

The drain electrode of the selection transistor 25 is connected to the source electrode of the amplification transistor 24, and the source electrode is connected to the vertical signal line 32. To the gate electrode of the selection transistor 25, a selection signal SEL for which a high level becomes active is supplied from the row selection part 12. The selection transistor 25 becomes conductive in response to the selection signal SEL, thereby transmitting the signal output from the amplification transistor 24 to the vertical signal line 32 with the pixel 2 selected.

Note that the selection transistor 25 can also have a circuit configuration connected between the node of the high-potential-side power supply voltage $V_{DD}$ and the drain electrode of the amplification transistor 24. Furthermore, in this example, as the pixel circuit of the pixel 2, the 4 Tr configuration including the transfer transistor 22, the reset transistor 23, the amplification transistor 24, and the selection transistor 25, that is, four transistors (Tr) has been described as an example, but the configuration is not limited to this. For example, the pixel circuit of the pixel 2 can have a 3 Tr configuration in which the selection transistor 25 is omitted and the amplification transistor 24 has the function of the selection transistor 25, and a 5 Tr or higher configuration in which the number of transistors is increased, as necessary.

Configuration of Analog-Digital Conversion Part

Figure 3:
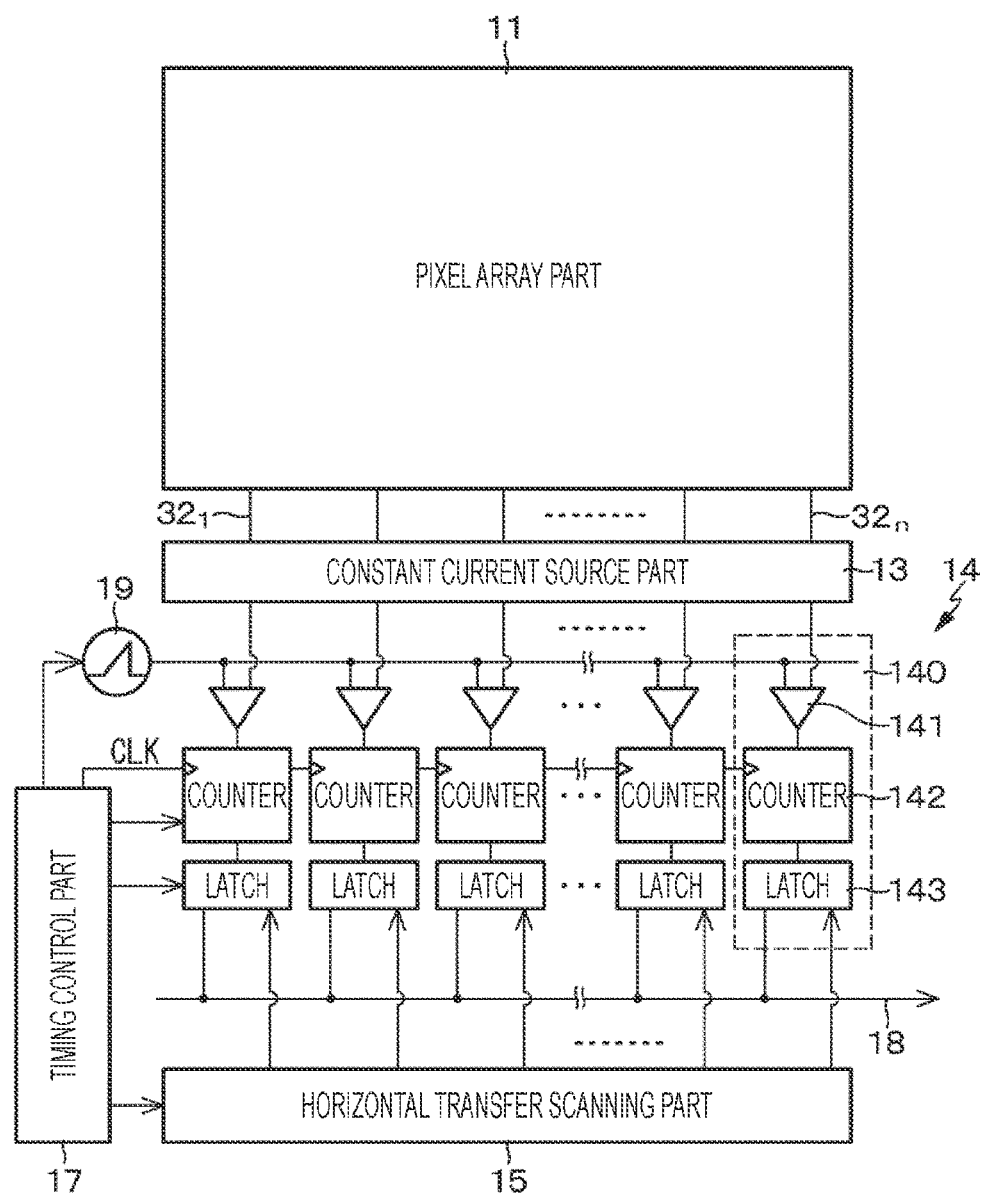
FIG. 3 is a block diagram showing an example of a configuration of a column parallel analog-digital conversion part mounted on the CMOS image sensor.

Next, a configuration example of the column parallel analog-digital conversion part 14 will be described. FIG. 3 is a block diagram showing an example of the configuration of the column parallel analog-digital conversion part 14. The analog-digital conversion part 14 in the CMOS image sensor 1 of the present disclosure includes a set of a plurality of single slope analog-digital converters provided corresponding to each of the vertical signal lines $32_1$ to $32_n$. Here, the nth column single slope analog-digital converter 140 will be described as an example.

The single slope analog-digital converter 140 has a circuit configuration including a comparator 141, a counter circuit 142, and a latch circuit 143. The single slope analog-digital converter 140 uses a so-called ramp waveform (slope waveform) reference signal whose voltage value changes linearly with time. The ramp waveform reference signal is generated by the reference signal generation part 19. The reference signal generation part 19 can be configured using, for example, a digital-analog conversion (DAC) circuit.

The comparator 141 uses an analog pixel signal read from the pixel 2 as a comparison input and the ramp waveform reference signal generated by the reference signal generation part 19 as a reference input, and compares the two signals. Then, for example, an output of the comparator 141 is in a first state (for example, high level) when the reference signal is larger than the pixel signal, and in a second state (for example, low level) when the reference signal is the pixel signal or smaller. Therefore, the comparator 141 outputs, as the comparison result, a pulse signal having a pulse width corresponding to the signal level of the pixel signal, specifically, the magnitude of the signal level.

A clock signal CLK is supplied from the timing control part 17 to the counter circuit 142 at the same timing as the timing of starting the supply of the reference signal to the comparator 141. Then, the counter circuit 142 measures the pulse width period of the output pulse of the comparator 141, that is, the period from the start of the comparison operation to the end of the comparison operation, by performing the counting operation in synchronization with the clock signal CLK. The count result (count value) of the counter circuit 142 is a digital value obtained by digitizing an analog pixel signal.

The latch circuit 143 holds (latches) the digital value that is the count result of the counter circuit 142. Furthermore, the latch circuit 143 performs correlated double sampling (CDS), which is an example of noise removal processing, by determining the difference between a D-phase count value corresponding to the signal level pixel signal and a P-phase count value corresponding to the reset level pixel signal. Then, under the drive of the horizontal transfer scanning part 15, the latched digital value is output to the horizontal transfer line 18.

As described above, in the column parallel analog-digital conversion part 14 including the set of the single slope analog-digital converters 140, a digital value is obtained from time information obtained before the magnitude relationship between the reference signal of the linearly changing analog value generated by the reference signal generation part 19 and the analog pixel signal output from the pixel 2 changes. Note that, in the example described above, the analog-to-digital conversion part 14 in which the analog-digital converter 140 is arranged in a one-to-one relationship with respect to the pixel column is illustrated, but the analog-to-digital part 14 may be configured such that the analog-digital converter 140 is arranged in units of a plurality of pixel columns.

Stacked Type Chip Structure

A chip (semiconductor integrated circuit) structure of the CMOS image sensor 1 having the configuration described above is a stacked chip structure (so-called stacked chip). Furthermore, as the structure of the pixel 2, when a substrate surface on a side where the wiring layer is formed is a front surface, a rear surface emission pixel structure in which light is emitted from the rear surface opposite to the front surface can be adopted, or a front surface emission type pixel structure in which light is emitted from the front surface side can be adopted.

Figure 4:
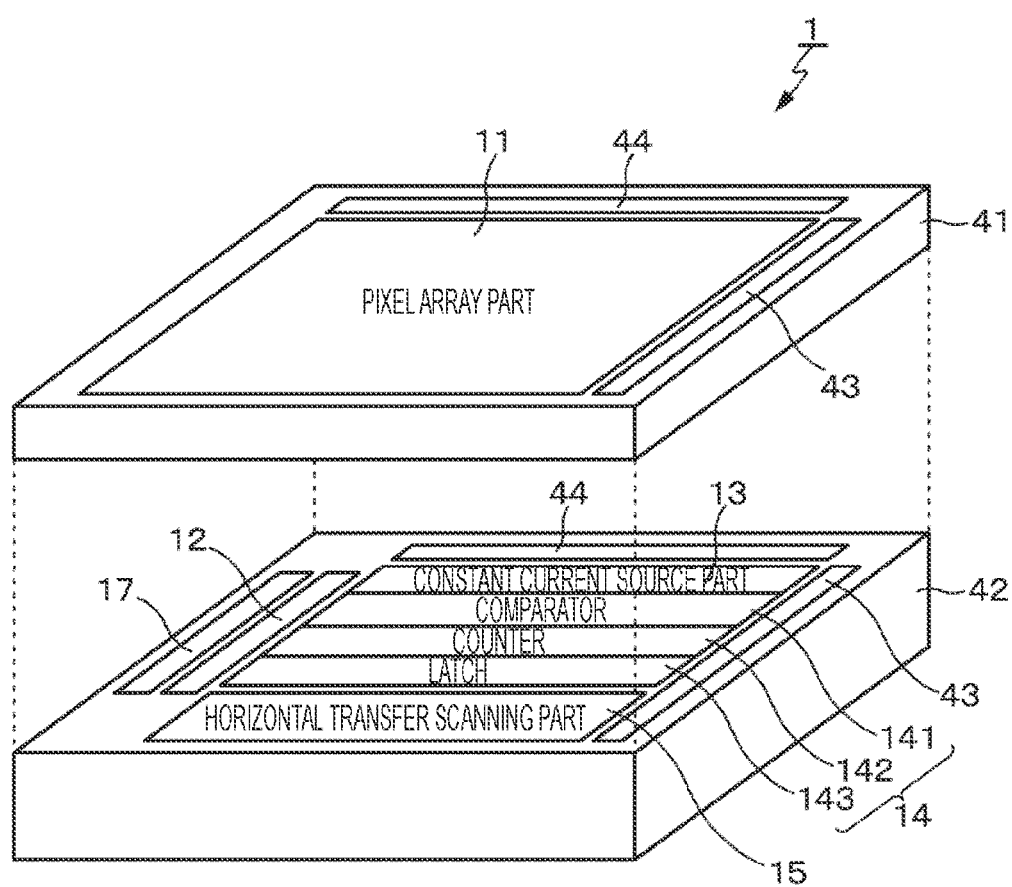
FIG. 4 is an exploded perspective view showing an outline of a stacked type chip structure.

FIG. 4 is an exploded perspective view showing an outline of a stacked type chip structure of the CMOS image sensor 1. As shown in FIG. 4, the stacked type chip structure has a structure in which at least two semiconductor substrates, that is, a first semiconductor substrate 41 and a second semiconductor substrate 42, are stacked. In this stacked structure, each pixel 2 of the pixel array part 11, the control lines $31_1$ to $31_m$, and the vertical signal lines $32_1$ to $32_n$ are formed on the first semiconductor substrate 41 that is the first layer. Furthermore, the pixel control part including the row selection part 12, the constant current source part 13, the analog-digital conversion part 14, the horizontal transfer scanning part 15, the signal processing part 16, the timing control part 17, the reference signal generation part 19, and the like is formed on the second semiconductor substrate 42 that is the second layer. The pixel control part is a peripheral circuit part of the pixel array part 11. Then, the first semiconductor substrate 41 that is the first layer and the second semiconductor substrate 42 that is the second layer are electrically connected by connecting parts 43 and 44 such as through chip via (TCV) or Cu-Cu hybrid bonding.

With the CMOS image sensor 1 having this stacked structure, the size (area) of the first semiconductor substrate 41 that is the first layer is sufficient if it can form the pixel array part 11, and thus the size (area) of the first semiconductor substrate 41 that is the first layer, and eventually, the size of the entire chip can be reduced. Moreover, since a process suitable for manufacturing the pixel 2 can be applied to the first semiconductor substrate 41 that is the first layer, and a process suitable for manufacturing a pixel control part can be applied to the second semiconductor substrate 42 that is the second layer, there is also an advantage that the process can be optimized in manufacturing the CMOS image sensor 1. In particular, in manufacturing the pixel control part, an advanced process can be applied.

Note that, here, the stacked structure of the two-layer structure formed by stacking the first semiconductor substrate 41 and the second semiconductor substrate 42 is exemplified, but the stacked structure is not limited to the two-layer structure, and a structure of three or more layers can also be adopted. Then, in a case of a stacked structure of three or more layers, the pixel control part including the row selection part 12, the constant current source part 13, the analog-digital conversion part 14, the horizontal transfer scanning part 15, the signal processing part 16, the timing control part 17, the reference signal generation part 19, and the like can be formed dispersedly on the semiconductor substrates that are the second layer and subsequent to the second layer.

By the way, in selecting good/defective products of the CMOS image sensor 1, inspection is performed for presence/absence of opening (breaking) of wirings such as the control lines $31_1$ to $31_m$ and the vertical signal lines $32_1$ to $32_n$ and presence/absence of short circuit between adjacent wirings. In a case of a stacked chip having a three-dimensional structure (a stacked chip structure) in which the first semiconductor substrate 41 on which the pixel array part 11 is formed and the second semiconductor substrate 42 on which the pixel control part is formed are bonded to each other, it is general to select a good product/defective product in an inspection in a wafer state which is a final shape after the first semiconductor substrate 41 and the second semiconductor substrate 42 are bonded to each other.

A stacking method of stacked chips includes a method of bonding wafers to each other (wafer on wafer: WOW), a method of bonding a wafer to a non-defective chip (chip on wafer: COW), and the like. In a case of the COW-method stacked chip, unlike the case of the WOW-method stacked chip, the yield can be increased by selectively combining a good product and a good product.

By the way, in the case of the stacked structure shown in FIG. 4, on the first semiconductor substrate 41 side, the pixel circuit is configured only by N-channel transistors as shown in FIG. 2 by optimizing the area efficiency and the viewpoint of process reduction. Then, the pixel control part, which is a peripheral circuit of the pixel array part 11, is formed on the second semiconductor substrate 42 side. That is, the pixel control part is not mounted on the first semiconductor substrate 41 side. Therefore, in a case of a COW-method stacked chip, it is difficult to select a good product/defective product on the side of the first semiconductor substrate 41 that is the sensor substrate (pixel chip) before bonding, and the yield improvement effect is suppressed.

As described above, the first semiconductor substrate 41 and the second semiconductor substrate 42 are electrically connected by the connection parts 43 and 44 such as through chip via (TCV) and Cu-Cu hybrid bonding, and the connection parts 43 and 44 include connection nodes to which the control lines $31_1$ to $31_m$ and the vertical signal lines $32_1$ to $32_n$ are connected. Then, the number of connection nodes of the connection parts 43 and 44 is proportional to the number of pixels of the pixel array part 11, and is tens of thousands. By mounting needle contact terminals on all of these connection nodes, it is also possible to perform inspection for opening/short circuit of the wirings of the control lines $31_1$ to $31_m$ and the vertical signal lines $32_1$ to $32_n$. However, the size of the needle contact terminals is several tens of times larger than the terminal pitch and the number of terminals, and it is not realistic in terms of area to mount the needle contact terminals on all the connection nodes.

Description of Embodiments

Figure 5:
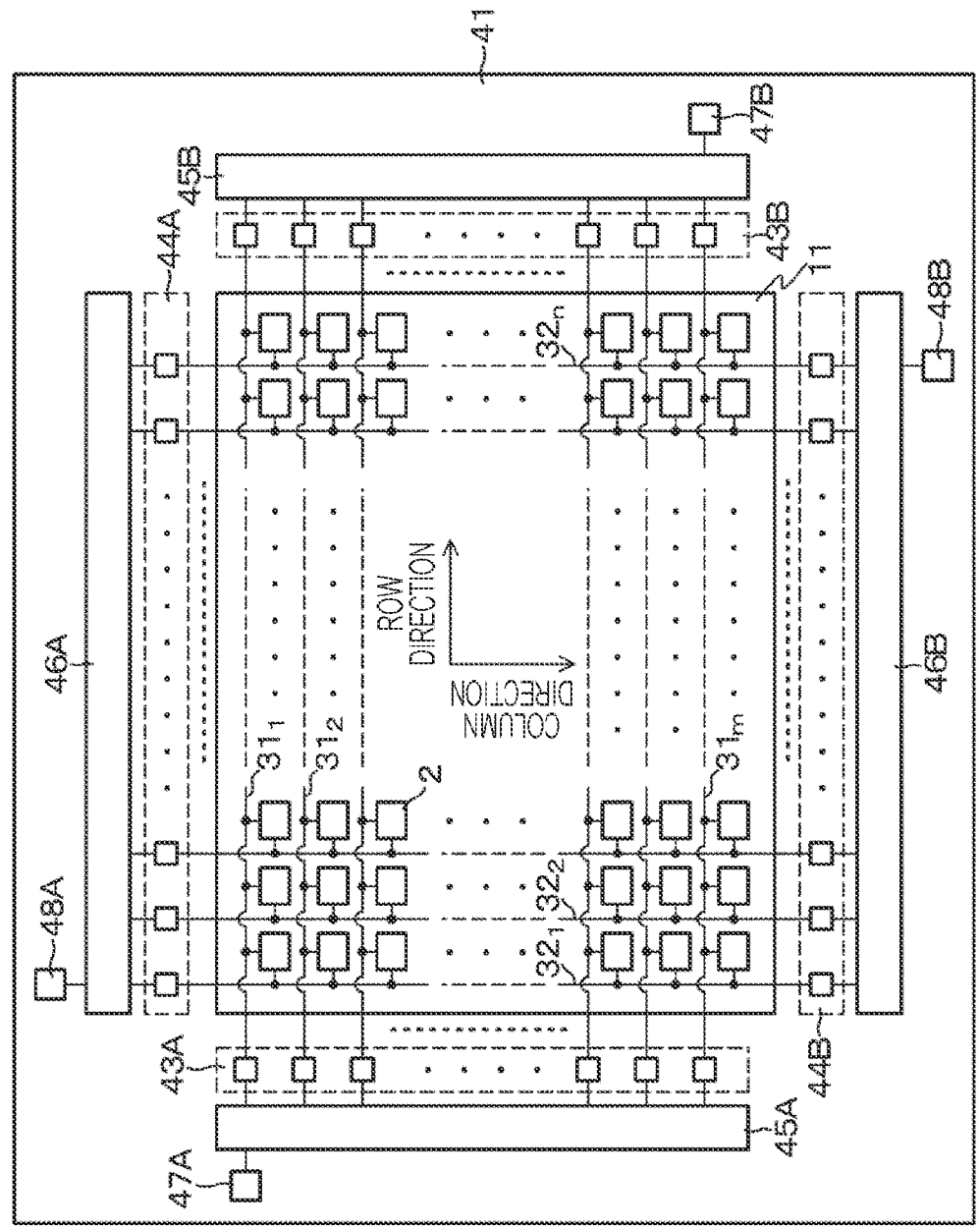
FIG. 5 is a schematic configuration diagram showing a specific configuration of a first semiconductor substrate according to an embodiment of the present disclosure.

In recent imaging elements of stacked structure, in order to increase the number of pixels and speed, the defective rate tends to be higher in the wirings of the control lines $31_1$ to $31_m$ and the vertical signal lines $32_1$ to $32_n$, and connection nodes of the connection parts 43 and 44 than in the pixel single body. Therefore, in the embodiment of the present disclosure, in the first semiconductor substrate 41 that is the sensor substrate on which the pixel array part 11 is formed, the main focus is on checking of only the wiring layer, and minimum numbers of circuits are added, so that it is possible to inspect for presence or absence of opening/short circuit of the wiring with a small number of needle contact terminals. The specific configuration of the first semiconductor substrate 41 according to the embodiment of the present disclosure will be described below with reference to FIG. 5.

On the first semiconductor substrate 41 that is the first substrate, the first wiring is formed corresponding to the first pixel row or pixel column, and the second wiring is formed corresponding to the second pixel row or pixel column. Here, the first wiring formed corresponding to the pixel row refers to the control line $31_1$ formed corresponding to the first pixel row, and the second wiring formed corresponding to the pixel row refers to the control line $31_m$ formed corresponding to the mth pixel row. Then, there is a plurality of wirings, that is, the control line $31_2$ to the control line $31_{m-1}$ between the first wiring and the second wiring.

Furthermore, the first wiring formed corresponding to the pixel column refers to the vertical signal line $32_1$ formed corresponding to the first pixel column, and the second wiring formed corresponding to the pixel column refers to the vertical signal line $32_n$ formed corresponding to the nth pixel column. Then, there is a plurality of wirings, that is, the vertical signal line $32_2$ to the vertical signal line $32_{n-1}$ between the first wiring and the second wiring.

As described with reference to FIG. 4, the first semiconductor substrate 41 has connection parts 43 (43A and 43B) and 44 (44A and 44B) that connects wirings (control lines $31_1$ to $31_m$ and vertical signal lines $32_1$ to $32_n$) formed on the first semiconductor substrate 41 and the pixel control part formed on the second semiconductor substrate 42 that is the second substrate. The first semiconductor substrate 41 is further provided with switch parts 45A and 45B, switch parts 46A and 46B, first electrodes 47A and 48A and second electrodes 47B and 48B. The first electrodes 47A and 48A and the second electrodes 47B and 48B are needle contact terminals used for inspection in a wafer state.

The switch parts 45A and 45B control the connection between the control line $31_1$ that is the first wiring and the control line $31_m$ that is the second wiring. The switch parts 46A and 46B control the connection between the vertical signal line $32_1$ that is the first wiring and the vertical signal line $32_n$ that is the second wiring. The first electrode 47A is connected to the control line $31_1$ via the switch part 45A. The second electrode 47B is connected to the control line $31_m$ via the switch part 45B. The first electrode 48A is connected to the vertical signal line $32_1$ via the switch part 46A. The second electrode 48B is connected to the vertical signal line $32n$ via the switch part 46B. The first electrodes 47A and 48A and the second electrodes 47B and 48B are needle contact terminals.

As described above, according to the present embodiment, in the CMOS image sensor 1 having a three-dimensional stacked structure, minimum numbers of circuits of the switch parts 45A and 45B, the switch parts 46A and 46B, the first electrodes 47A and 48A and the second electrodes 47B and 48B are added, so that it is possible to achieve inspection for presence or absence of opening/short circuit of the wiring. As a result, it is possible to achieve both suppression of an increase in chip area and improvement in yield.

Specific examples of the present embodiment that achieves inspection for opening/short circuit of the wiring by adding minimum numbers of circuits of the switch parts 45A and 45B, the switch parts 46A and 46B, the first electrodes 47A and 48A and the second electrodes 47B and 48B will be described.

The switch parts 45A and 45B, the first electrode 47A, and the second electrode 47B for inspecting the presence or absence of opening/short circuit of the control lines $31_1$ to $31_m$ will be described below.

First Embodiment

Figure 6:
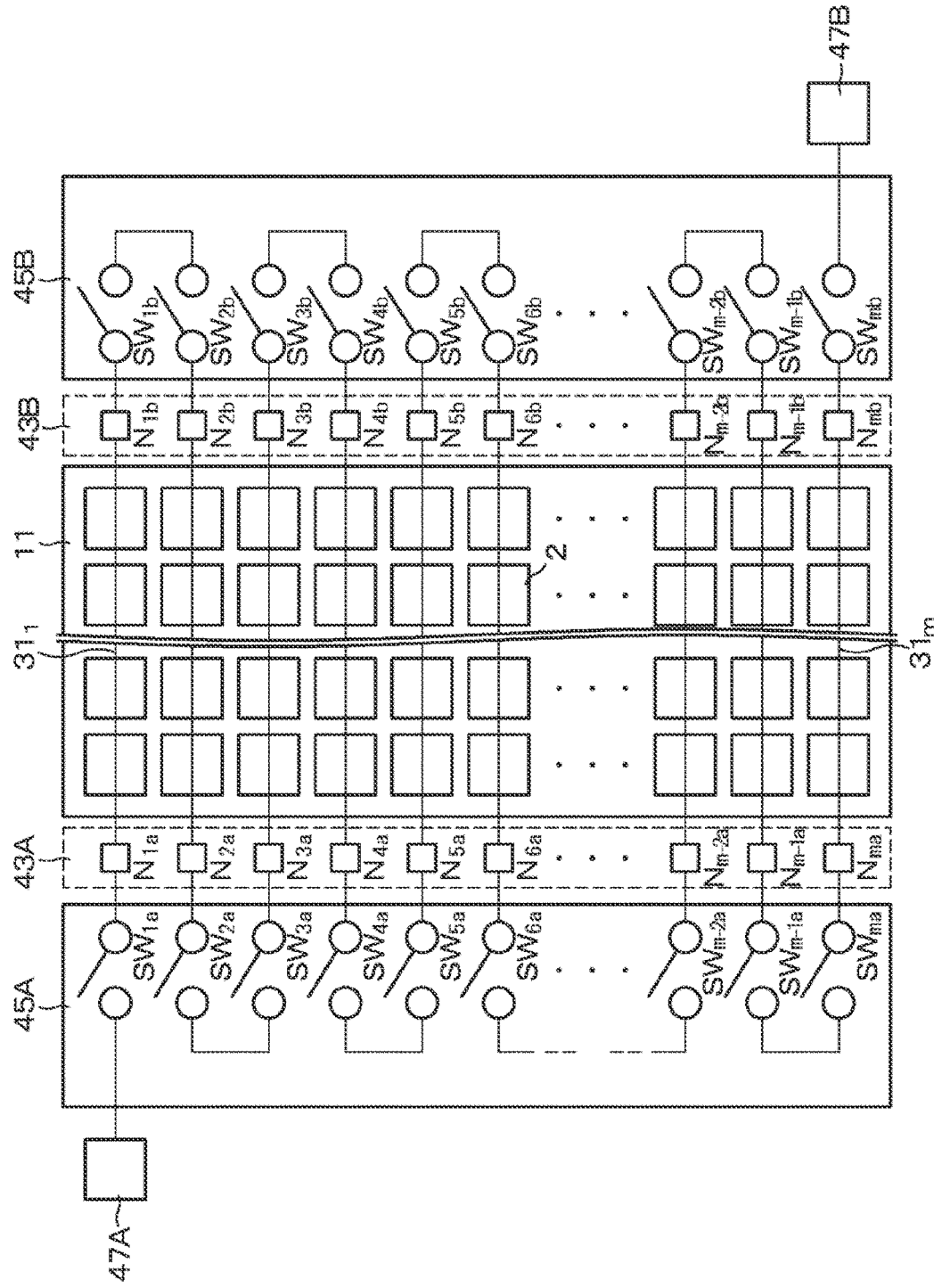
FIG. 6 is a circuit diagram showing a circuit example of a switch part according to a first embodiment.

The first embodiment is a circuit example of the switch parts 45A and 45B for inspecting presence or absence of opening (breaking) of the control lines $31_1$ to $31_m$. FIG. 6 shows a circuit example of the switch parts 45A and 45B according to the first embodiment.

Each of the connection parts 43A and 43B includes the number of connection nodes $N_{1a}$ to $N_{ma}$ and $N_{1b}$ to $N_{mb}$ corresponding to the number of rows of the pixel array part 11. Then, both ends of the control lines $31_1$ to $31_m$ are connected to these connection nodes $N_{1a}$ to $N_{ma}$ and $N_{1b}$ to $N_{mb}$.

Each of the switch parts 45A and 45B includes the number of switch elements $SW_{1a}$ to $SW_{ma}$ and $SW_{1b}$ to $SW_{mb}$ corresponding to the number of rows of the pixel array part 11. The switch parts 45A and 45B turn on (close) the switch elements $SW_{1a}$ to $SW_{ma}$ and $SW_{1b}$ to $SW_{mb}$ during the opening inspection (test) of the control lines $31_1$ to $31_m$, so that a daisy chain is made in which the control lines $31_1$ to $31_m$ are connected in series, as described below.

In the switch part 45A, one end of the switch element $SW_{1a}$ in the first row is connected to the first electrode 47A. The other ends of the switch elements $SW_{1a}$ to $SW_{ma}$ in each row are connected to the connection nodes $N_{1a}$ to $N_{ma}$ of the connecting part 43A. Then, one ends of the switch element $SW_{2a}$ in the second row and the switch element $SW_{3a}$ in the third row are commonly connected, and one ends of the switch element $SW_{4a}$ in the fourth row and the switch element $SW_{5a}$ in the fifth row are commonly connected. Thereafter, similarly, one ends of the switch elements are commonly connected for every two rows, and finally, one ends of the switch element $SW_{m-1a}$ in the m-1th row and the switch element $SW_{ma}$ in the mth row are commonly connected.

In the switch part 45B, one ends of the switch elements $SW_{1b}$ to $SW_{mb}$ in each row are connected to the connection nodes Nth to $N_{mb}$ of the connecting part 43B, respectively. Then, the other ends of the switch element $SW_{1b}$ in the first row and the switch element $SW_{2b}$ in the second row are commonly connected, and the other ends of the switch element $SW_{3b}$ in the third row and the switch element $SW_{4b}$ in the fourth row are commonly connected. Thereafter, similarly, the other ends of the switch elements are commonly connected for every two rows, and finally, the other ends of the switch element. $SW_{m-2a}$ in the m-2th row and the switch element $SW_{m-1a}$ in the m-1th row are commonly connected. Then, the other end of the switch element $SW_{mb}$ on the mth row is connected to the second electrode 47B.

As described above, in the first embodiment, one daisy chain is formed in which the control lines $31_1$ to $31_m$ are connected in series between the first electrode 47A and the second electrode 47B by the action of the switch elements of the switch part 45A and the switch part 45B. As described above, by connecting the control lines $31_1$ to $31_m$ in a daisy chain, a small number of needle contact terminals of the first electrode 47A and the second electrode 47B can be used to perform an opening inspection (test) of a plurality of wirings (control lines $31_1$ to $31_m$).

Figure 7:
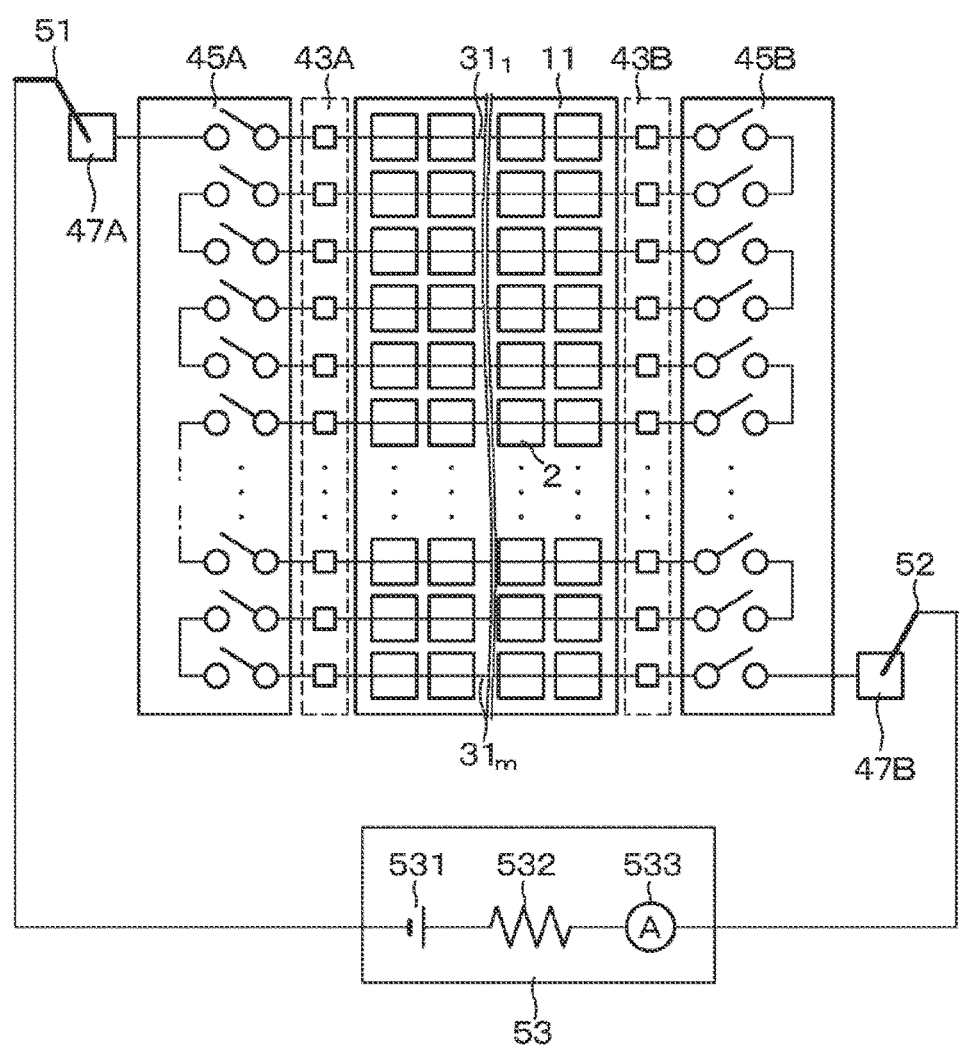
FIG. 7 is a circuit diagram showing a circuit example for performing an opening test of one daisy chain in the first embodiment.

FIG. 7 shows a circuit example for performing an opening test of one daisy chain. Two measurement probes 51 and 52 are used for the opening test of one daisy chain. Then, a measurement circuit 53 is connected between the measurement probes 51 and 52, and the measurement probes 51 and 52 are brought into contact with the first electrode 47A and the second electrode 47B, which are needle contact terminals, so that the opening test of one daisy chain can be performed. The measurement circuit 53 connected between the measurement probes 51 and 52 can have a circuit configuration in which a DC power source 531, a resistance element 532, and an ammeter 533 are connected in series, for example.

In the first embodiment described above, the switch parts 45A and 45B for inspecting the presence or absence of opening of the control lines $31_1$ to $31_m$, the first electrode 47A, and the second electrode 47B are described as an example. This is similar for the switch parts 46A and 46B for inspecting presence or absence of opening of the vertical signal lines $32_1$ to $32_n$, the first electrode 48A, and the second electrode 48B.

Furthermore, both of the control lines $31_1$ to $31_m$ and the vertical signal lines $32_1$ to $32_n$ are inspected for presence or absence of opening in the configuration of the first embodiment described above. However, a configuration can be adopted in which any one of the control lines $31_1$ to $31m$ and the vertical signal lines $32_1$ to $32n$ is inspected for presence or absence of opening.

Second Embodiment

Figure 8:
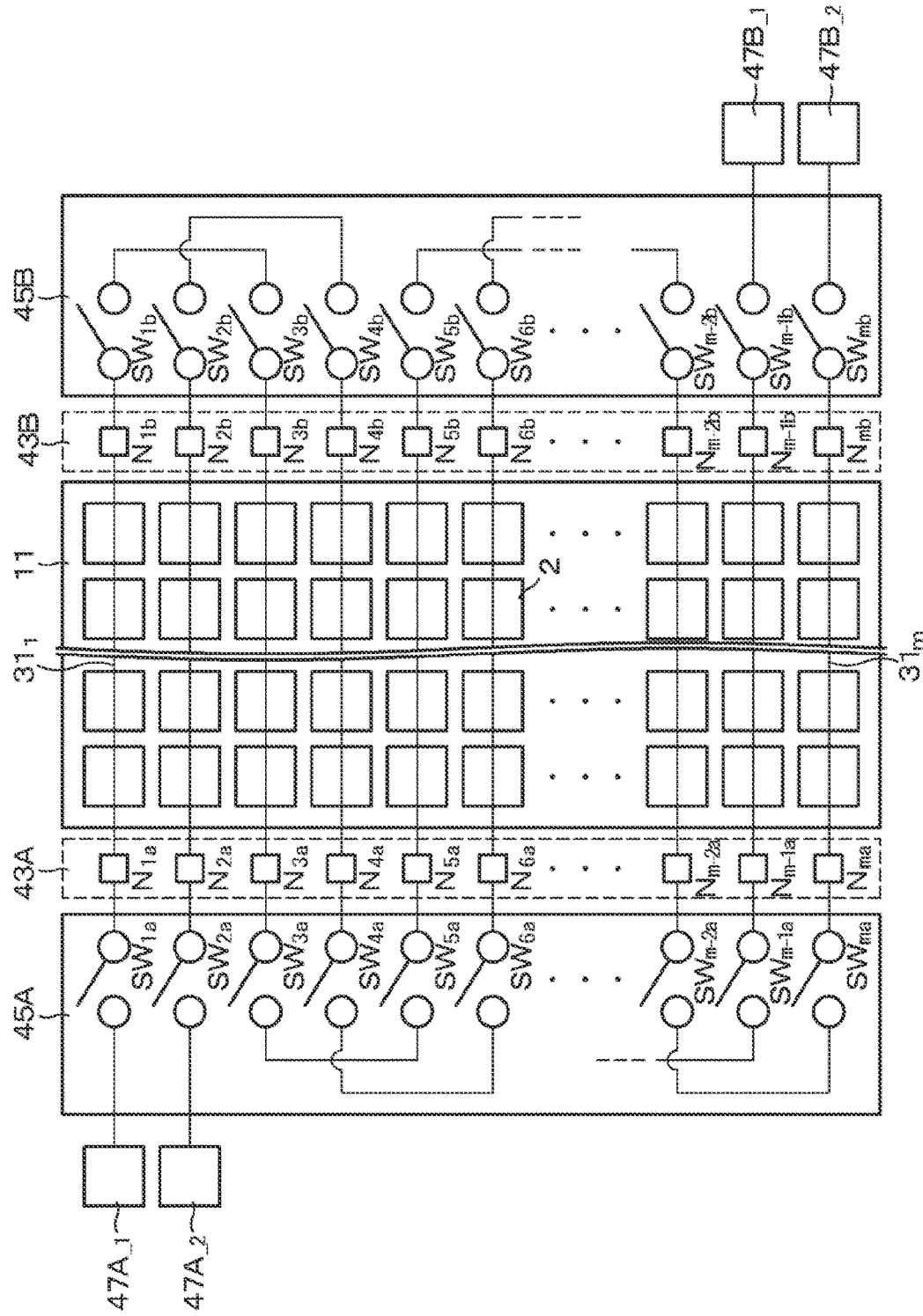
FIG. 8 is a circuit diagram showing a circuit example of a switch part according to a second embodiment.

The second embodiment is a circuit example of the switch parts 45A and 45B for inspecting presence or absence of opening (breaking) of the control lines $31_1$ to $31_m$ and presence or absence of a short circuit between adjacent wirings. FIG. 8 shows a circuit example of the switch parts 45A and 45B according to the second embodiment.

In a case of second embodiment, two first electrodes 47A and two second electrodes 47B are provided in order to achieve a short test between adjacent wirings (first electrodes $47A_{-1}$ and $47A_{-2}$ and second electrodes $47B_{-1}$ and $47B_{-2}$).

In the switch part 45A, one ends of the switch element $SW_{1a}$ in the first row and the switch element $SW_{2a}$ in the second row are connected to the first electrodes $47A_{-1}$ and $47A_{-2}$, respectively. The other ends of the switch elements $SW_{1a}$ to $SW_{ma}$ in each row are connected to the connection nodes $N_{1a}$ to $N_{ma}$ of the connecting part 43A. Then, one ends of the switch element $SW_{3a}$ in the third row and the switch element $SW_{5a}$ in the fifth row are commonly connected, and one ends of the switch element $SW_{4a}$ in the fourth row and the switch element $SW_{6a}$ in the sixth row are commonly connected. Thereafter, similarly, one ends of the switch elements are commonly connected for every two rows for every other row, and finally, one ends of the switch element $SW_{m-2s}$ in the m-2th row and the switch element $SW_{ma}$ in the mth row are commonly connected.

In the switch part 45B, one ends of the switch elements $SW_{1b}$ to $SW_{mb}$ in each row are connected to the connection nodes $N_{1b}$ to $N_{mb}$ of the connecting part 43B, respectively. Then, the other ends of the switch element $SW_{1b}$ in the first row and the switch element $SW_{3b}$ in the third row are commonly connected, and the other ends of the switch element $SW_{2b}$ in the second row and the switch element $SW_{4b}$ in the fourth row are commonly connected. Thereafter, similarly, one ends of the switching elements for every two rows are connected in common for every other row. Then, other ends of the switch element $SW_{m-a1}$ in the m-1th row and the switch element $SW_{mb}$ in the mth row are connected to the second electrodes $47B_{-1}$ and $47B_{-2}$, respectively.

As described above, in the second embodiment, two daisy chains are formed in which the control lines $31_1$ to $31_m$ are connected in series between the first electrode $47A_{-1}$ and the second electrode $47B_{-1}$, and between the first electrode $47A_{-2}$ and the second electrode $47B_{-2}$ for every odd row and even row (that is, every other row) by the action of the switch elements of the switch part 45A and the switch part 45B. As described above, by connecting the control lines $31_1$ to $31_m$ in a daisy chain for every other row, a small number of needle contact terminals of the first electrode $47A_{-1}$ and $47A_{-2}$ and the second electrode $47B_{-1}$ and $47B_{-2}$ can be used to perform an opening test of a plurality of wirings (control lines $31_1$ to $31_m$).

Figure 9:
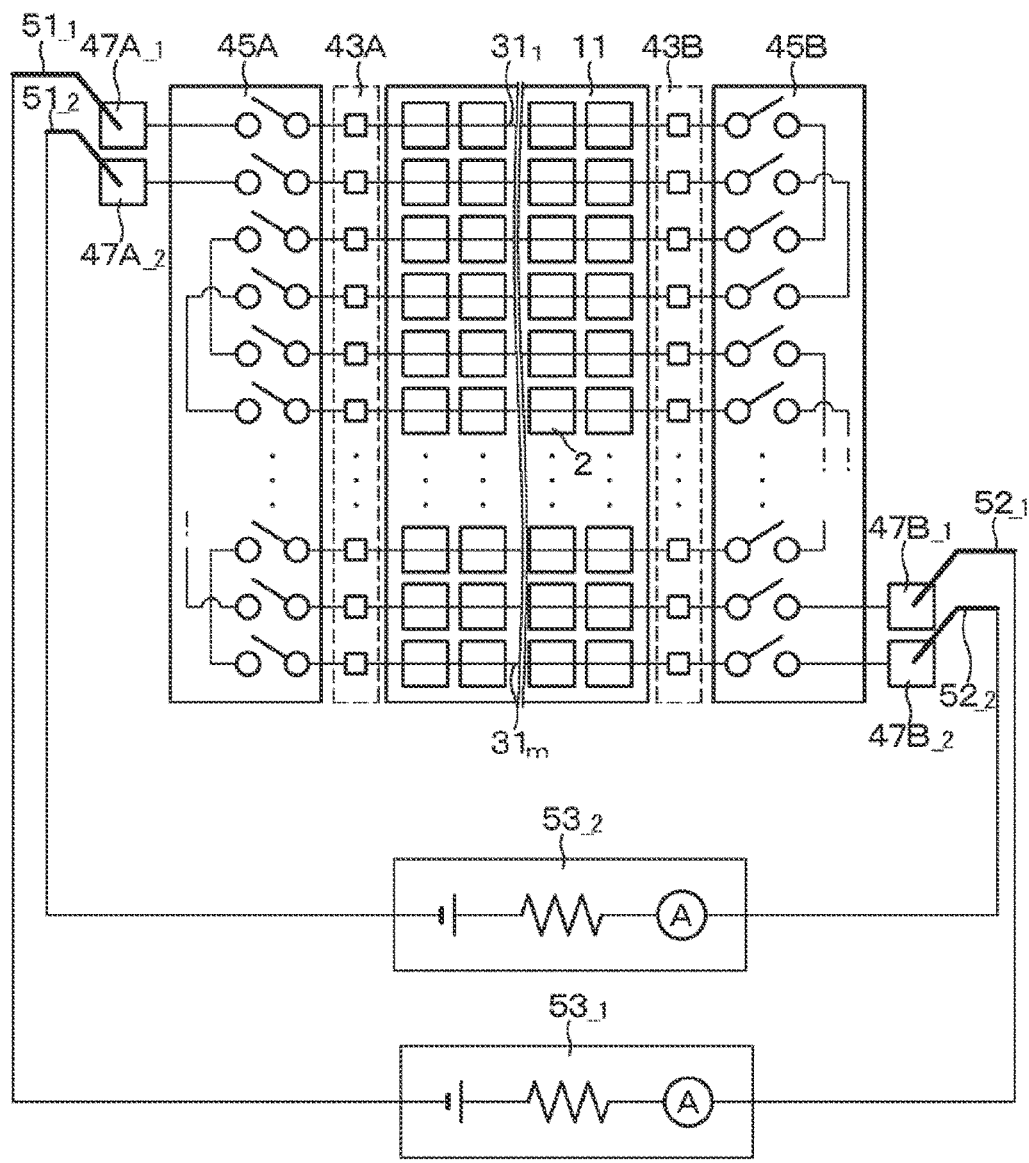
FIG. 9 is a circuit diagram showing a circuit example for performing an opening test of two daisy chains in the second embodiment.

FIG. 9 shows a circuit example for performing an opening test of two daisy chains. Four measurement probes $51_{-1}$, $51_{-2}$, $52_{-1}$, and $52_{-2}$ are used for the opening test of two daisy chains. Then, the measurement circuit $53_{-1}$ is connected between the measurement probes $51_{-1}$ and $52_{-1}$, the measurement circuit $53_{-2}$ is connected between the measurement probes $51_{-2}$ and $52_{-2}$, and the measurement probes $51_{-1}$, $51_{-2}$, $52_{-1}$, and $52_{-2}$ are brought into contact with the first electrodes $47A_{-1}$ and $47A_{-2}$ and the second electrodes $47B_{-1}$ and $47B_{-2}$, so that an opening test of two daisy chains can be performed. The measurement circuits $53_{-1}$, $53_{-2}$ can be configured similarly with the first embodiment.

Furthermore, in the second embodiment, in addition to the opening test, the control lines $31_1$ to $31_m$ can be inspected (tested) for presence or absence of a short circuit between adjacent wirings (control lines). The short-circuit test between the adjacent wirings can be performed by checking whether or not a current flows between the two (two systems of) daisy chains when a predetermined voltage is applied across the two daisy chains.

Figure 10:
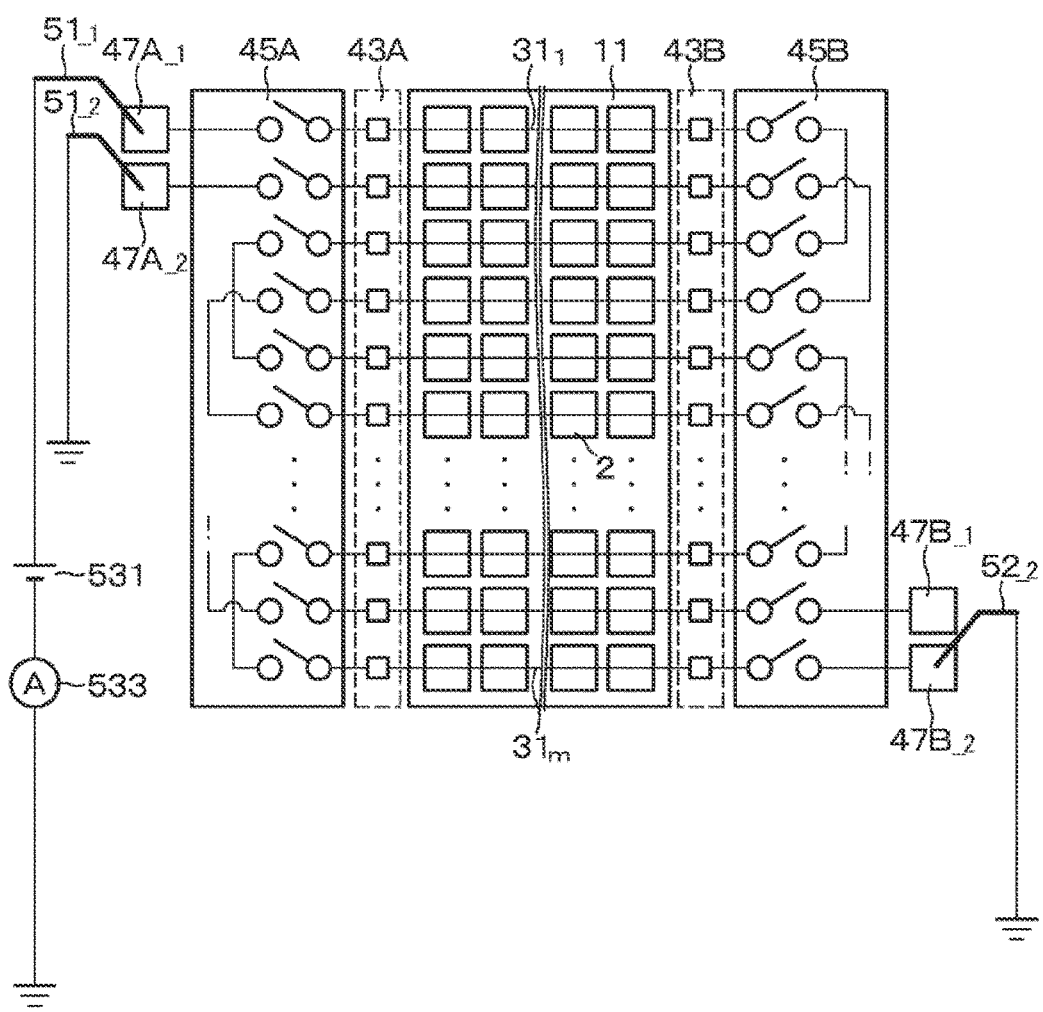
FIG. 10 is a circuit diagram showing a circuit example for performing a short circuit test between adjacent wirings (control lines) in the second embodiment.

FIG. 10 shows a circuit example for performing a short circuit test between adjacent wirings. For example, the first electrode $47A_{-1}$ and the second electrode $47B_{-1}$ are connected to the ground (grounded) as the reference potential via the measurement probe $51_{-2}$ and the measurement probe $52_{-2}$. Then, the DC power source 531 and the ammeter 533 are connected in series between the measurement probe $51_{-1}$ and the ground, and the measurement probe $51_{-1}$ is brought into contact with the first electrode $47A_{-1}$. Therefore, inspection for presence or absence of a short circuit between adjacent wirings can be performed by applying a predetermined voltage across the two daisy chains, and checking whether or not a current flows between the two daisy chains.

In the second embodiment described above, the switch parts 45A and 45B for performing an opening/short circuit test of the control lines $31_1$ to $31_m$, the first electrode 47A, and the second electrode 47B are described as an example. This is similar for the switch parts 46A and 46B for performing an opening/short circuit test of the vertical signal lines $32_1$ to $32_n$, the first electrode 48A, and the second electrode 48B.

Furthermore, both of the control lines $31_1$ to $31_m$ and the vertical signal lines $32_1$ to $32_n$ are subjected to an opening/ short circuit test in the configuration in the second embodiment described above. However, a configuration can be adopted in which any one of the control lines $31_1$ to $31_m$ and the vertical signal lines $32_1$ to $32_n$ is subjected to an opening/ short circuit test.

Third Embodiment

Figure 11:
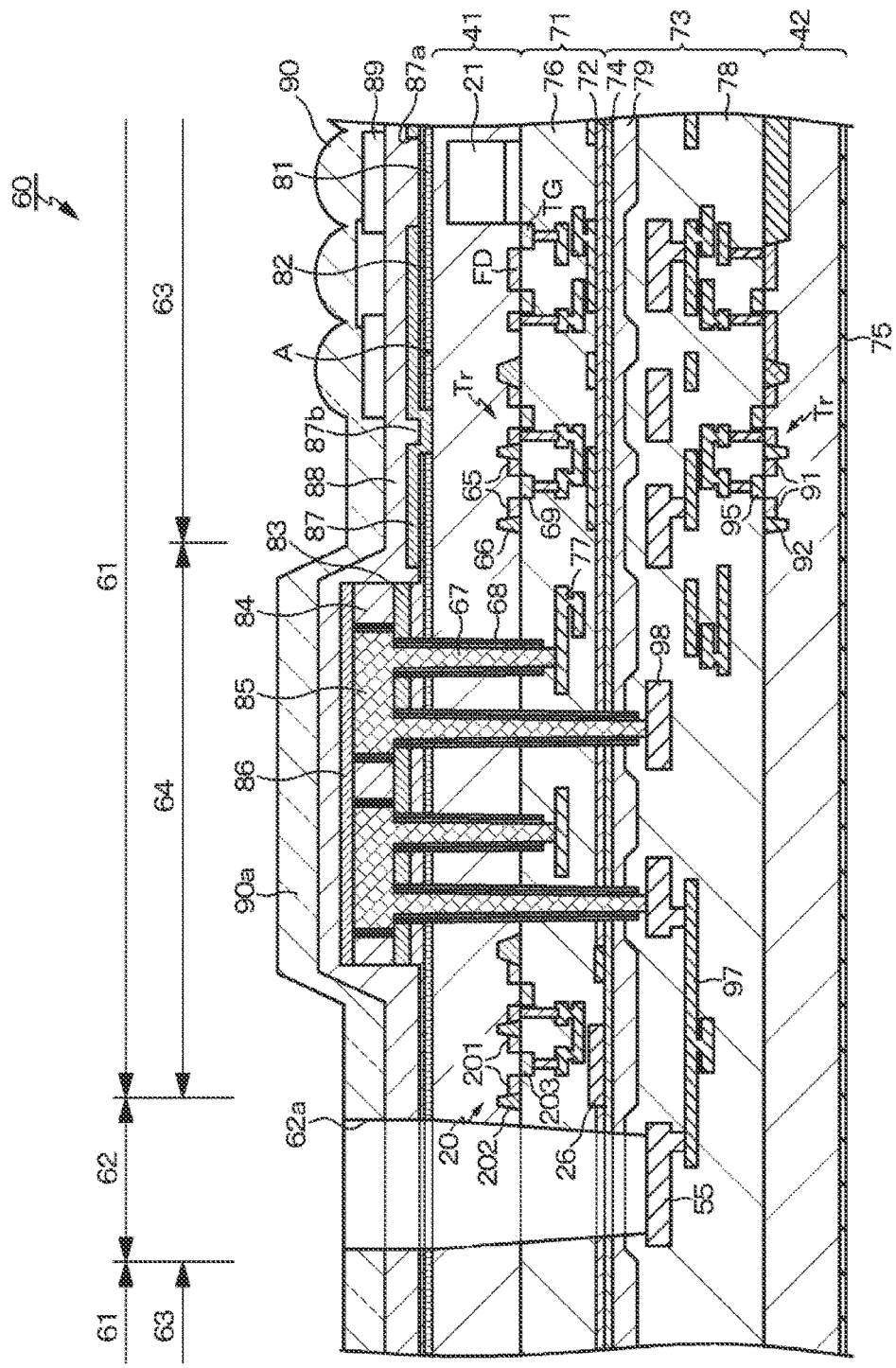
FIG. 11 is a cross-sectional view showing a main part of an imaging element wafer according to a third embodiment.

A third embodiment is an example of an imaging element wafer having a wiring opening/short circuit test function. FIG. 11 shows a cross-section of a main portion of the imaging element wafer according to the third embodiment. An imaging element wafer 60 according to the third embodiment has a three-dimensional structure in which the first semiconductor substrate 41 that is a sensor substrate on which the pixel array part 11 is formed, and the second semiconductor substrate 42 that is a circuit substrate on which the peripheral circuit part of the pixel array part 11 is formed are bonded to each other in a stacked state.

The imaging element wafer 60 according to the third embodiment includes a chip region 61 and a PAD region 62 when seen in a plan view. Then, the chip region 61 includes a pixel region 63 and a peripheral region 64.

A wiring layer 71 and a protective film 72 covering the wiring layer 71 are provided on the surface of the first semiconductor substrate 41 opposite to a light receiving surface A, that is, on the surface of the second semiconductor substrate 42 side. On the other hand, a wiring layer 73 and a protective film 74 covering the wiring layer 73 are provided on the front surface side of the second semiconductor substrate 42, that is, on the surface on the first semiconductor substrate 41 side. Furthermore, a protective film 75 is provided on the rear surface side of the second semiconductor substrate 42. The first semiconductor substrate 41 and the second semiconductor substrate 42 are bonded to each other between the protective film 72 and the protective film 74.

An antireflection film 81, an interface state suppressing film 82, an etching stop film 83, a wiring groove forming film 84, a wiring 85, a cap film 86, and a light shielding film 87 are provided on the rear surface side of the first semiconductor substrate 41, that is, on the light receiving surface A. Then, a transparent protective film 88, a color filter 89, and an on-chip lens 90 are stacked in this order on the light shielding film 87.

In the imaging element wafer 60 having the above-described layer structure, the wiring layer 73 in the PAD region 62 is provided with a device terminal 55, and the device terminal 55 is connected to an embedded wiring 97 of a drive circuit extended from the wiring layer 73 in the chip region 61. Moreover, the PAD region 62 is provided with an opening 62a that opens to the light receiving surface A side, and the opening 62a is formed as a through hole that exposes the device terminal 55.

Next, in the imaging element wafer 60 having the configuration described above, the details of the configuration of each layer of the first semiconductor substrate 41, the configuration of each layer of the second semiconductor substrate 42, and the configuration of each layer on the light receiving surface A will be described in order.

First Semiconductor Substrate/Sensor Substrate

The first semiconductor substrate 41 is, for example, a thin film of a single crystal silicon substrate. In the pixel region 63 in each chip region 61 of the first semiconductor substrate 41, a plurality of photodiodes (photoelectric conversion parts) 21 is arrayed along the light receiving surface A. The photodiode 21 has, for example, a stacked structure of an n-type diffusion layer and a p-type diffusion layer. Note that the photodiode 21 is provided for each pixel, and FIG. 11 shows a sectional structure for one pixel.

Furthermore, in the chip region 61 of the first semiconductor substrate 41, on the surface side opposite to the light receiving surface A, a floating diffusion FD including an n+ type impurity layer, a source/drain region 65 of a transistor Tr, and moreover, other impurity layers (not shown here), element isolation regions 66, and the like are provided.

Moreover, in the chip region 61 of the first semiconductor substrate 41, a through via 67 penetrating the first semiconductor substrate 41 is provided in the peripheral region 64 outside the pixel region 63. The through via 67 includes a conductive material embedded in the connection hole formed through the first semiconductor substrate 41 via an isolation insulating film 68.

In the chip region 61 of the wiring layer 71 provided on the surface of the first semiconductor substrate 41, a transfer gate TG, a gate electrode 69 of the transistor Tr, and other electrodes (not shown here) are provided on the interface side with the first semiconductor substrate 41 via a gate insulating film (not shown here). Here, the transfer gate TG corresponds to the gate electrode of the transfer transistor 22 in the pixel circuit of FIG. 2, and the transistor Tr corresponds to another transistor.

The transfer gate TG and the gate electrode 69 are covered with an interlayer insulating film 76, and embedded wirings 77 including, for example, copper (Cu) are provided as multilayer wiring in the groove pattern provided in the interlayer insulating film 76. These embedded wirings 77 are connected to each other by vias, and a part of them is connected to the source/drain region 66, the transfer gate TG, and further to the gate electrode 69. Furthermore, the embedded wiring 77 is also connected to the through via 67 provided in the first semiconductor substrate 41, and the pixel circuit is configured by the transistor Tr, the embedded wiring 77, and the like.

A protective film 72 having an insulating property is provided on the interlayer insulating film 76 on which the embedded wiring 77 as described above is formed. Then, on the surface of the protective film 72, the first semiconductor substrate 41 that is a sensor substrate is bonded to and stacked on the second semiconductor substrate 42 that is a circuit substrate.

Second Semiconductor Substrate/Circuit Board

The second semiconductor substrate 42 is, for example, a thin film of a single crystal silicon substrate. In the chip region 61 of the second semiconductor substrate 42, on the surface layer of the first semiconductor substrate 41 side, a source/drain region 91 of the transistor Tr, and moreover, an impurity layer (not shown here), an element isolation region 92, and the like are provided.

In the chip region 61 of the wiring layer 73 provided on the surface of the second semiconductor substrate 42, a gate electrode 95, and moreover, another electrode (not shown here) are provided on the interface side with the second semiconductor substrate 42 via a gate insulating film (not shown here). These gate electrode 95 and the another electrode are covered with an interlayer insulating film 78, and embedded wirings 97 including, for example, copper (Cu) are provided as multilayer wiring in the groove pattern provided in the interlayer insulating film 78. These embedded wirings 97 are connected to each other by vias, and a part of them is connected to the source/drain region 91 and the gate electrode 95.

Moreover, an aluminum wiring 98 is provided on the second semiconductor substrate 42 side of the multilayer wiring. The aluminum wiring 98 is connected to the embedded wiring 97 by a via and is covered with an interlayer insulating film 78. The surface of the interlayer insulating film 78 has an uneven shape corresponding to the aluminum wiring 98, a flattening film 79 is provided so as to cover the uneven surface, and the surface of the flattening film 79 is a flat surface.

A protective film 74 having an insulating property is provided on the flattening film 79 as described above, and the second semiconductor substrate 42 that is a circuit substrate is bonded to and stacked on the first semiconductor substrate 41 that is a sensor substrate, on the surface of the protective film 74. Furthermore, in the second semiconductor substrate 42, a protective film 75 covering the second semiconductor substrate 42 is provided on the rear surface side opposite to the front surface side on which the wiring layer 73 is provided.

Layers and the Like on Light Receiving Surface A

Subsequently, each layer on the light receiving surface A, that is, the antireflection film 81, the interface state suppressing film 82, the etching stop film 83, the wiring groove forming film 84, the wiring 85, the cap film 86, the light shielding film 87, the transparent protective film 88, the color filter 89, and the on-chip lens 90 will be described.

In the peripheral region 64 of the chip region 61, on the light receiving surface A of the first semiconductor substrate 41, the antireflection film 81, the interface state suppressing film 82, the etching stop film 83, and the wiring groove forming film 84 are provided in order from the light receiving surface A side. Moreover, the wiring 85 is provided in the wiring groove forming film 84, and the cap film 86 is provided so as to cover the wiring 85.

In the pixel region 63 of the chip region 61, the antireflection film 81, the interface state suppressing film 82, and the light shielding film 87 are provided on the light receiving surface A of the first semiconductor substrate 41. In the PAD region 62, the antireflection film 81 and the interface state suppressing film 82 are provided on the light receiving surface A of the first semiconductor substrate 41.

The materials as described below can be used as the material of each layer in each layer having the above-described configuration. The antireflection film 81 is made by using an insulating material having a higher refractive index than that of silicon oxide, such as hafnium oxide ($HfO_2$), tantalum oxide ($Ta_2O_5$), or silicon nitride. The interface state suppressing film 82 is made by using, for example, silicon oxide ($SiO_2$). The etching stop film 83 is made by using a material having a low etching selection ratio with respect to the material of the wiring groove forming film 84 that is the upper layer, and is made by using, for example, silicon nitride (SiN). The wiring groove forming film 84 is configured by using, for example, silicon oxide ($SiO_2$). The cap film 86 is configured by using, for example, silicon nitride (SiN).

Wiring 85

The wiring 85 is provided as an embedded wiring embedded in the wiring groove forming film 84 on the light receiving surface A in the peripheral region 64 of the chip region 61. The wiring 85 is formed integrally with the through vias 67 and connects the through vias 67. The upper portion of the wiring 85 is covered with the cap film 86.

Through via 67

The through via 67 is provided in a state of penetrating from the wiring 85 on the light receiving surface A to the etching stop film 83, the interface state suppressing film 82, and the antireflection film 81 in the peripheral region 64 of the chip region 61, and further to the first semiconductor substrate 41 so as to reach the wiring layer 71. A plurality of the through vias 67 is provided and are connected to the embedded wiring 77 of the first semiconductor substrate 41 and the aluminum wiring 98 or the embedded wiring 97 of the second semiconductor substrate 42.

The wiring 85 and the through via 67 are formed integrally by embedding copper (Cu) in the wiring groove and the connection hole through the wiring groove formed in the wiring groove forming film 84 and the isolation insulating film 68 that continuously covers the inner wall of the connection hole at the bottom of the wiring groove. Here, the part of the wiring groove corresponds to the wiring 85, and the part of the connection hole corresponds to the through via 67. Furthermore, the isolation insulating film 68 is configured by using a material having a copper (Cu) diffusion preventing function such as silicon nitride (SiN).

As described above, by connecting the through vias 67 with the wiring 85, the embedded wiring 77 of the first semiconductor substrate 41 and the aluminum wiring 98 or the embedded wiring 97 of the second semiconductor substrate 42, the through vias 67 being connected to the embedded wiring 77 and the aluminum wiring 98 or the embedded wiring 97, are electrically connected. That is, by connecting the through vias 67 with the wiring 85, the drive circuit of the first semiconductor substrate 41 and the drive circuit of the second semiconductor substrate 42 are connected.

Light shielding film 87

The light shielding film 87 is provided above the interface state suppressing film 82 on the light receiving surface A in the pixel region 63 of the chip region 61, and has a plurality of light receiving openings 87a corresponding to the photodiodes (photoelectric conversion parts) 21. Such a light shielding film 87 is configured by using a conductive material having an excellent light shielding property such as aluminum (Al) or tungsten (W), and is provided in a state of being grounded to the first semiconductor substrate 41 in the opening 87b.

Transparent protective film 88

The transparent protective film 88 is provided in the chip region 61 and the PAD region 62 in a state of covering the cap film 86 and the light shielding film 87 on the light receiving surface A. The transparent protective film 88 is made by an insulating material and is configured by using, for example, acrylic resin.

Color filter 89 and on-chip lens 90

In the pixel region 63 of the chip region 61, the color filter 89 and the on-chip lens 90 corresponding to each photodiode 21 are provided on the transparent protective film 88. The color filter 89 includes colors corresponding to the photodiodes 21. The array of the color filters 89 for each color is not particularly limited. The on-chip lens 90 focuses the incident light on each photodiode 21. On the other hand, in the peripheral region 64 of the chip region 61 and the PAD region 62, the on-chip lens film 90a integrated with the on-chip lens 90 is provided on the transparent protective film 88.

In the imaging element wafer 60 having the structure described above, the through via 67 that is provided in a state of penetrating the first semiconductor substrate 41 and reaching the wiring layer 71 and being connected to the embedded wiring 77 corresponds to the connection nodes $N_{1a}$ to $N_{ma}$ and $N_{1b}$ to $N_{mb}$ of the connecting parts 43A and 43B shown in FIG. 6, for example. Then, the switch elements $SW_{1a}$ to $SW_{ma}$ and $SW_{1b}$ to $SW_{mb}$ of the switch parts 45A and 45B are connected to the through via 67 via the embedded wiring 77.

The imaging element wafer 60 according to the third embodiment adopts a configuration in which, for example, the transistor 20 is used as the switch elements $SW_{1a}$ to $SW_{ma}$ and $SW_{1b}$ to $SW_{mb}$ of the switch parts 45A and 45B in FIG. 6. From the viewpoint of the process, as the transistor 20, it is more preferable to use a transistor of the same conductivity type as the transistor (transfer transistor 22, reset transistor 23, amplification transistor 24, and selection transistor 25 of FIG. 2) that configures the pixel 2 (in the case of FIG. 2, N-channel transistors) compared with a transistor of a different conductivity type.

The source/drain region 201 of the transistor 20 serving as a switch element is provided on the surface side opposite to the light receiving surface A in the chip region 61 of the first semiconductor substrate 41. This is similar for other impurity layers (not shown here), the element isolation region 202, and the like. Furthermore, the gate electrode 203 of the transistor 20 is provided on the interface side with the first semiconductor substrate 41 via a gate insulating film (not shown here) in the chip region 61 of the wiring layer 71 provided on the surface of the first semiconductor substrate 41.

Furthermore, in the chip region 61 of the first semiconductor substrate 41, the measurement pad 26 is provided in the same layer as the protective film 72 covering the wiring layer 71. The measurement pad 26 is an electrode pad corresponding to the first electrode 47A and the second electrode 47B of FIG. 6 and the first electrodes $47A_{-1}$ and $47A_{-2}$ and the second electrodes $47B_{-1}$ and $47B_{-2}$ of FIG. 8. The measurement pad 26 is a needle contact terminal used for inspection for an opening/short circuit of the wiring on the first semiconductor substrate 41 side before the first semiconductor substrate 41 and the second semiconductor substrate 42 are bonded to each other.

MODIFICATION

Although the technology of the present disclosure has been described above on the basis of the preferred embodiments, the technique of the present disclosure is not limited to the embodiments. The configuration and structure of the imaging element described in each of the above embodiments are illustrative and can be changed as appropriate.

First Modification

In the embodiment described above, the case where the wirings (control lines $31_1$ to $31_m$/vertical signal lines $32_1$ to $32_n$) are inspected for the presence or absence of opening/short circuit has been described as an example. However, the inspection is not limited to the inspection for the presence or absence of opening/short circuit. For example, by detecting the short circuit between the wirings (control lines $31_1$ to $31_m$/vertical signal lines $32_1$ to $32_n$) and the reference potential, inspection for the quality of the transistor configuring the pixel 2 (whether or not the oxide film is broken) can be performed.

Second Modification

Figure 12:
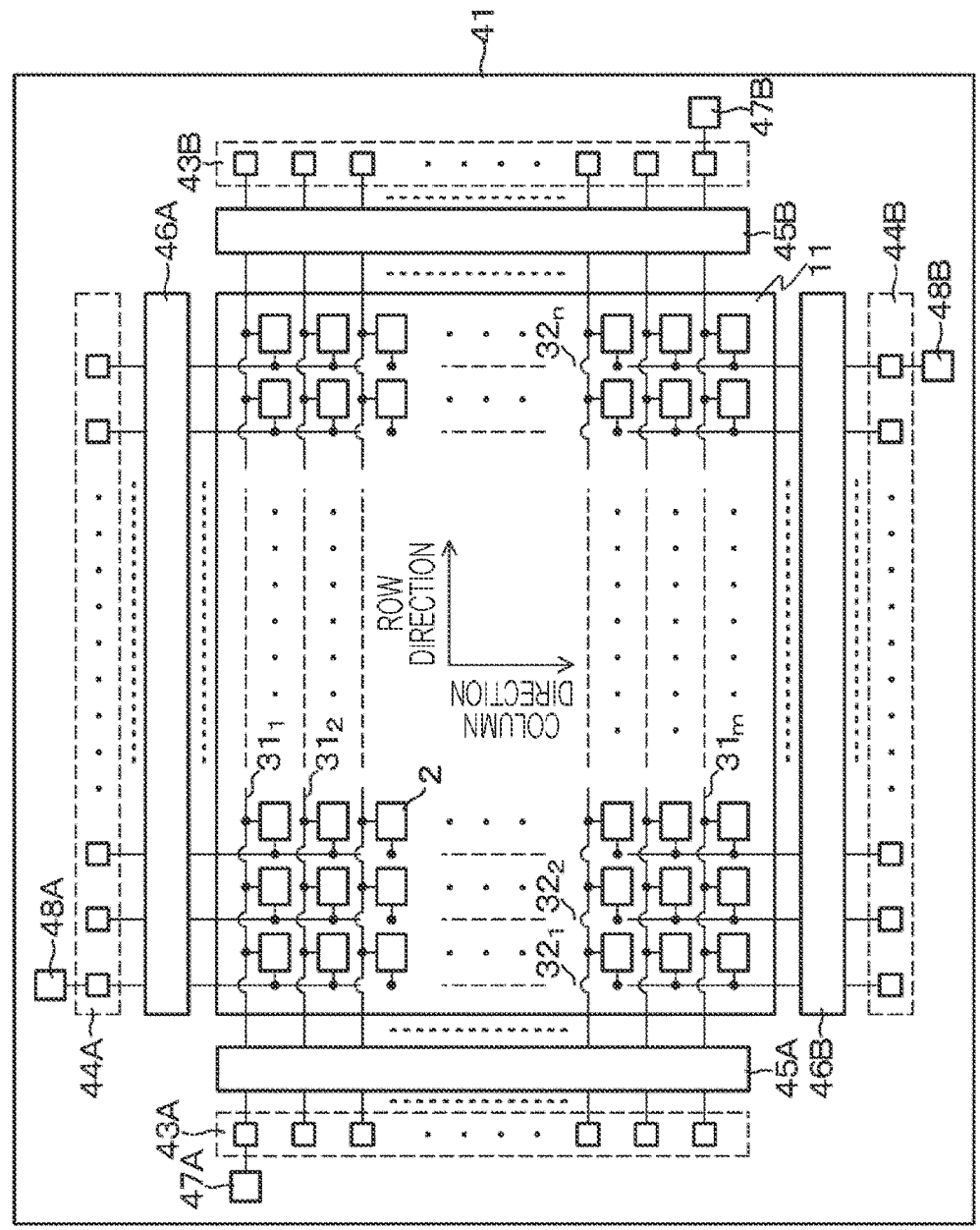
FIG. 12 is a schematic configuration diagram showing a specific configuration of a first semiconductor substrate according to a modification of the present disclosure.

Furthermore, in the embodiment described above, the configuration is illustrated in which the switch parts 45A and 45B and the switch parts 46A and 46B are arranged outside the connection parts 43 and 44 (on the opposite side to the pixel array part 11) (see FIG. 5), but is not limited to this configuration. That is, as shown in FIG. 12, it is possible to adopt a configuration in which the switch parts 45A and 45B and the switch parts 46A and 46B are arranged closer to the pixel array part 11 side than the connection parts 43 and 44.

Third Modification

Furthermore, in the embodiment described above, the case is described as an example where the technology of the present disclosure is applied to the CMOS image sensor, but the technology of the present disclosure is not limited to the application to the CMOS image sensor, and can be applied to all X-Y address type imaging element in which the pixels 2 are two-dimensionally arranged in a matrix.

Fourth Modification

Furthermore, in the embodiment described above, the imaging element having a configuration in which the light receiving part (photoelectric conversion part) and the pixel circuit are both formed on the first semiconductor substrate 41 that is the first substrate is exemplified. In a case of light receiving element using a compound, however, only a light receiving part is formed on another substrate in some cases. In this case, a pixel circuit (or a part thereof) is formed on the first semiconductor substrate 41, and the pixel circuit is electrically connected to the light receiving part of another substrate by Cu-Cu hybrid bonding or the like.

Application Example

Figure 13:
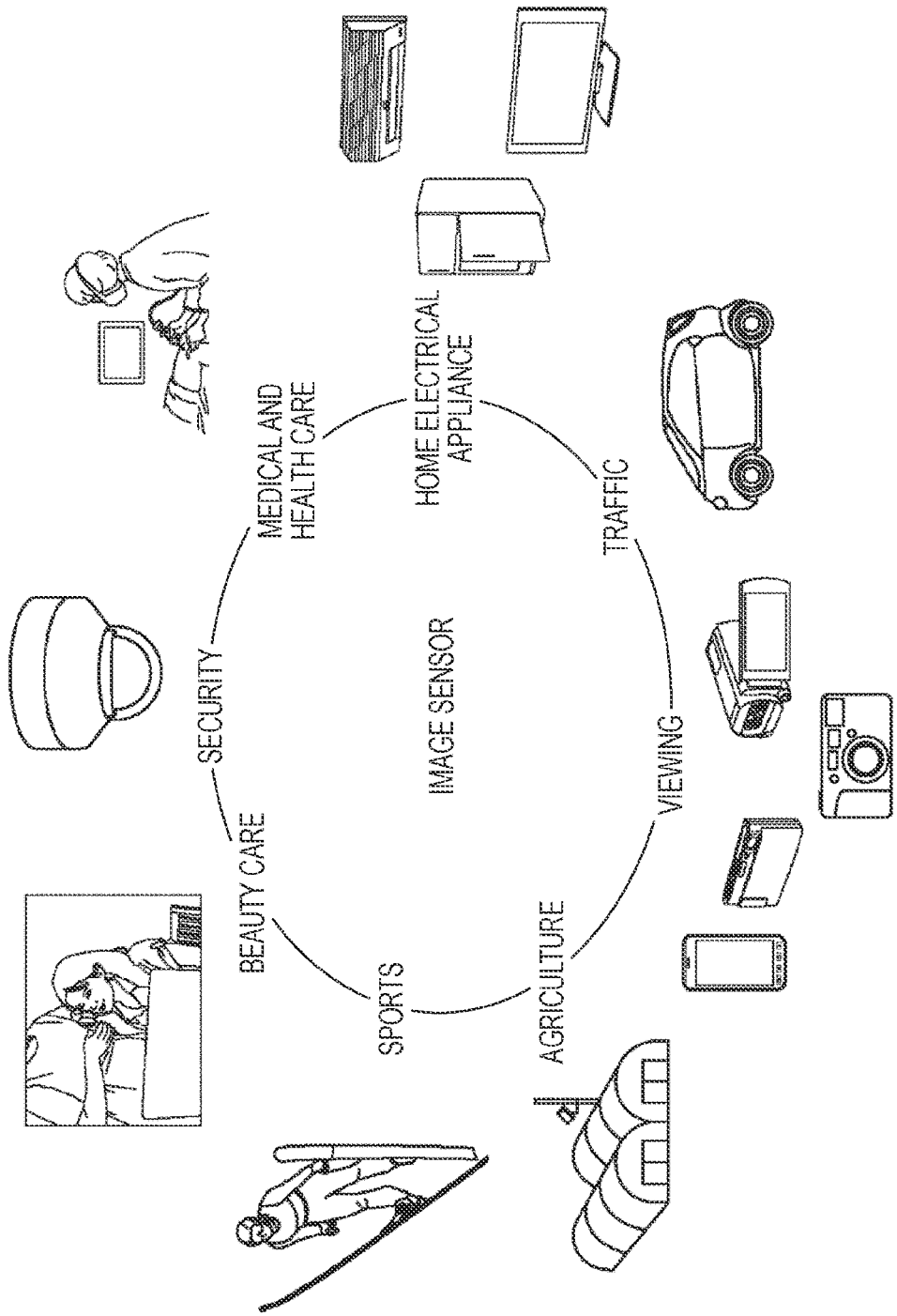
FIG. 13 is a diagram showing an application example of a technology according to the present disclosure.

The CMOS image sensor 1 according to the present embodiment described above can be used in various devices for example, for sensing light such as visible light, infrared light, ultraviolet light, or X-rays, as shown in FIG. 13. Specific examples of various devices are listed below.

A device for photographing an image used for viewing, such as a digital camera, a portable device with a camera function A device used for traffic purpose, such as: an in-vehicle sensor for photographing the front, rear, surroundings, inside of a car, or the like of an automobile for safe driving such as automatic stop and recognition of driver's condition or the like; a surveillance camera for monitoring traveling vehicles and roads; and a distance measuring sensor that measures the distance between vehicles or the like A device used for a home electrical appliance such as a TV, a refrigerator, and an air conditioner, to photograph user's gesture and perform equipment operation according to the gesture A device used for medical and health care, such as an endoscope, or a device for performing angiography by receiving infrared light A device used for security, such as a surveillance camera for preventing crime, and a camera for person authentication A device used for beauty care, such as a skin measuring instrument for photographing skin, and a microscope for photographing the scalp A device used for sport, such as an action camera or a wearable camera for sports applications or the like A device used for agriculture, such as a camera for monitoring the condition of fields and crops

Electronic Device of the Present Disclosure

The technology according to the present disclosure can be applied to various products. Here, a case will be described where the technology according to the present disclosure is applied to an imaging device such as a digital still camera or a video camera, a mobile terminal device having an imaging function such as a mobile phone, or an electronic device such as a copying machine using an imaging element in an image reading part.

Imaging Device

Figure 14:
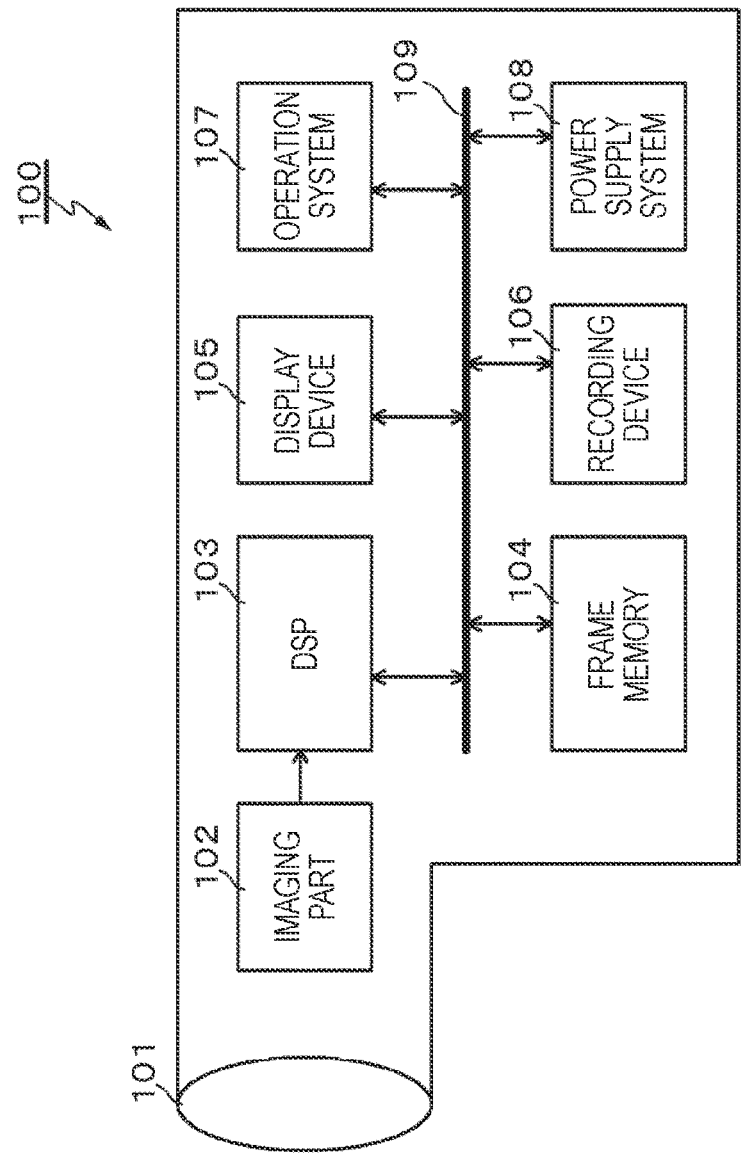
FIG. 14 is a block diagram showing a configuration of an imaging device which is an example of an electronic device of the present disclosure.

FIG. 14 is a block diagram showing a configuration of an imaging device which is an example of an electronic device of the present disclosure. As shown in FIG. 14, an imaging device 100 according to the present example includes an imaging optical system 101 including a lens group and the like, an imaging part 102, a digital signal processor (DSP) circuit 103, a frame memory 104, a display device 105, and a recording device 106, an operation system 107, a power supply system 108, and the like. Then, the DSP circuit 103, the frame memory 104, the display device 105, the recording device 106, the operation system 107, and the power supply system 108 are connected to each other via a bus line 109.

The imaging optical system 101 captures incident light (image light) from a subject and forms an image on the imaging surface of the imaging part 102. The imaging part 102 converts the light amount of the incident light formed as the image on the imaging surface by the optical system 101 into an electric signal in units of pixels, and outputs the electric signal as a pixel signal. The DSP circuit 103 performs general camera signal processing, such as white balance processing, demosaic processing, and gamma correction processing, for example.

The frame memory 104 is used to appropriately store data in the process of signal processing in the DSP circuit 103. The display device 105 includes a panel-type display device such as a liquid crystal display device or an organic electro luminescence (EL) display device, and displays a moving image or a still image captured by the imaging part 102. The recording device 106 records the moving image or the still image captured by the imaging part 102 on a recording medium such as a portable semiconductor memory, an optical disc, or a hard disk drive (HDD).

The operation system 107 issues operation commands for various functions of the imaging device 100 under the operation of the user. The power supply system 108 appropriately supplies various power supplies serving as operation power supplies of the DSP circuit 103, the frame memory 104, the display device 105, the recording device 106, and the operation system 107 to these supply targets.

In the imaging device 100 having the configuration described above, the CMOS image sensor 1 according to the above-described embodiments can be used as the imaging part 102. According to the CMOS image sensor 1, inspection of the wiring formed for each pixel row or each pixel column can be performed with a minimum number of additional circuits, so that an increase in chip area can be suppressed. Therefore, using the CMOS image sensor 1 according to the above-described embodiment as the imaging part 102 can contribute to suppressing the size increase of the imaging device 100.

Configuration that the Present Disclosure can have

The present disclosure can also adopt the following configuration.

A. Imaging Element

[A-1] An imaging element including
a first substrate on which a pixel circuit connected to a light receiving part is formed, and a second substrate on which a pixel control part that controls the pixel circuit is formed, the first substrate and the second substrate being stacked,
in which the first substrate includes
a first wiring formed corresponding to a first pixel row or pixel column,
a second wiring formed corresponding to a second pixel row or pixel column,
a first connection part that connects the first wiring and the pixel control part,
a second connection part that connects the second wiring and the pixel control part,
a switch part that controls connection between the first wiring and the second wiring,
a first electrode connected to the first wiring via the switch part, and
a second electrode connected to the second wiring via the switch part.

[A-2] The imaging element according to [A-1] described above,
in which the first wiring and the second wiring are provided for each pixel row, each column row, or each pixel row and each column row of pixel arrangement in a matrix.

[A-3] The imaging element according to [A-2] described above,
in which, in the switch part, the first wiring and the second wiring are connected in series between the first electrode and the second electrode.

[A-4] The imaging element according to [A-3] described above,
in which there is a plurality of wirings between the first wiring and the second wiring, and
in the switch part, the first wiring, the plurality of wirings, and the second wiring are connected in series between the first electrode and the second electrode.

[A-5] The imaging element according to [A-4] described above,
in which an inspection for presence or absence of breaking of the first wiring, the plurality of wirings, and the second wiring can be performed in between the first electrode and the second electrode.

[A-6] The imaging element according to [A-4] described above,
in which inspection for quality of a transistor included in a pixel can be performed in between the first electrode and the second electrode.

[A-7] The imaging element according to [A-4] described above, in which two of the first electrodes and two of the second electrodes are provided, and
in the switch part, the first wiring, the plurality of wirings, and the second wiring of odd rows/odd columns are connected in series between one of the first electrodes and one of the second electrodes, and the first wiring, the plurality of wirings, and the second wiring of even rows/even columns are connected in series between another of the first electrode and another of the second electrode.

[A-8] The imaging element according to [A-7] described above,
in which inspection for presence or absence of breaking of the wirings of the odd rows/odd columns can be performed in between the one of the first electrodes and the one of the second electrodes, and
inspection for presence or absence of breaking of the wirings of the even rows/even columns can be performed in between the another of the first electrode and the another of the second electrode.

[A-9] The imaging element according to [A-7] described above,
in which inspection for presence or absence of a short circuit between adjacent wirings can be performed by checking whether or not a current flows between the wirings connected in series in the odd rows/odd columns and the wirings connected in series in the even rows/even columns.

[A-10] The imaging element according to [A-1] described above to [A-9] described above,
in which a switch element included in the switch part includes a transistor of a same conductivity type as a conductivity type of a transistor included in a pixel.

B. Electronic Device

[B-1] An electronic device including an imaging element, the imaging element including
a first substrate on which a pixel circuit connected to a light receiving part is formed, and a second substrate on which a pixel control part that controls the pixel circuit is formed, the first substrate and the second substrate being stacked, in which the first substrate includes a first wiring formed corresponding to a first pixel row or pixel column, a second wiring formed corresponding to a second pixel row or pixel column, a first connection part that connects the first wiring and the pixel control part, a second connection part that connects the second wiring and the pixel control part, a switch part that controls connection between the first wiring and the second wiring, a first electrode connected to the first wiring via the switch part, and a second electrode connected to the second wiring via the switch part.

[B-2] The electronic device according to [B-1] described above, in which the first wiring and the second wiring are provided for each pixel row, each column row, or each pixel row and each column row of pixel arrangement in a matrix.

[B-3] The electronic device according to [B-2] described above, in which, in the switch part, the first wiring and the second wiring are connected in series between the first electrode and the second electrode.

[B-4] The electronic device according to [B-3] described above, in which there is a plurality of wirings between the first wiring and the second wiring, and in the switch part, the first wiring, the plurality of wirings, and the second wiring are connected in series between the first electrode and the second electrode.

[B-5] The electronic device according to [B-4] described above, in which an inspection for presence or absence of breaking of the first wiring, the plurality of wirings, and the second wiring can be performed in between the first electrode and the second electrode.

[B-6] The electronic device according to [B-4] described above, in which, inspection for quality of a transistor included in a pixel can be performed in between the first electrode and the second electrode.

[B-7] The electronic device according to [B-4] described above, in which two of the first electrodes and two of the second electrodes are provided, and in the switch part, the first wiring, the plurality of wirings, and the second wiring of odd rows/odd columns are connected in series between one of the first electrodes and one of the second electrodes, and the first wiring, the plurality of wirings, and the second wiring of even rows/even columns are connected in series between another of the first electrode and another of the second electrode

[B-8] The electronic device according to [B-7] described above, in which inspection for presence or absence of breaking of the wirings of the odd rows/odd columns can be performed in between the one of the first electrodes and the one of the second electrodes, and inspection for presence or absence of breaking of the wirings of the even rows/even columns can be performed in between the another of the first electrode and the another of the second electrode.

[B-9] The electronic device according to [B-7] described above, in which inspection for presence or absence of a short circuit between adjacent wirings can be performed by checking whether or not a current flows between the wirings connected in series in the odd rows/odd columns and the wirings connected in series in the even rows/even columns.

[B-10] The electronic device according to [B-1] described above to [B-9] described above, in which a switch element included in the switch part includes a transistor of a same conductivity type as a conductivity type of a transistor included in a pixel.

REFERENCE SIGNS LIST

1 CMOS image sensor
2 Pixel
11 Pixel array part
12 Row selection part
13 Constant current source part
14 Analog-digital conversion part
15 Horizontal transfer scanning part
16 Signal processing part
17 Timing control part
18 Horizontal transfer line
19 Reference signal generation part
21 Photodiode (photoelectric conversion part)
22 Transfer transistor
23 Reset transistor
24 Amplification transistor
25 Selection transistor
31 ($31_1$ to $31_m$) Control line
32 ($32_1$ to $32_n$) Vertical signal line
41 First semiconductor substrate (first substrate/sensor substrate)
42 Second semiconductor substrate (second substrate/circuit board)
43 (43A, 43B), 44 (44A, 44B) Connection part
45A, 45B, 46A, 46B Switch part
47A ($47A_{-1}$, $47A_{-2}$), 48A First electrode
47B ($47B_{-1}$, $47B_{-2}$), 48B Second electrode
60 Imaging element wafer

The invention claimed is:

1. An imaging element comprising:

a first substrate on which a pixel circuit connected to a light receiving part is formed, and a second substrate on which a pixel control part that controls the pixel circuit is formed, the first substrate and the second substrate being stacked, wherein the first substrate includes:

a first wiring formed corresponding to a first pixel row or pixel column, a second wiring formed corresponding to a second pixel row or pixel column, a first connection part that connects the first wiring and the pixel control part, a second connection part that connects the second wiring and the pixel control part, a switch part that controls connection between the first wiring and the second wiring, wherein the switch part includes a switch element, and wherein the switch element includes a transistor of a same conductivity type as a conductivity type of a transistor included in a pixel, a first electrode connected to the first wiring via the switch part, and a second electrode connected to the second wiring via the switch part.

2. The imaging element according to claim 1, wherein the first wiring and the second wiring are provided for each pixel row, each column row, or each of the pixel row and each of the column row of pixel arrangement in a matrix.

3. The imaging element according to claim 1, wherein, in the switch part, the first wiring and the second wiring are connected in series between the first electrode and the second electrode.

4. The imaging element according to claim 1, wherein there is a plurality of wirings between the first wiring and the second wiring, and in the switch part, the first wiring, the plurality of wirings, and the second wiring are connected in series between the first electrode and the second electrode.

5. The imaging element according to claim 4, wherein inspection for presence or absence of breaking of the first wiring, the plurality of wirings, and the second wiring is performed in between the first electrode and the second electrode.

6. The imaging element according to claim 4, wherein inspection for quality of the transistor included in the pixel is performed in between the first electrode and the second electrode.

7. The imaging element according to claim 4, wherein two of the first electrodes and two of the second electrodes are provided, and in the switch part, the first wiring, the plurality of wirings, and the second wiring of odd rows/odd columns are connected in series between one of the first two electrodes and one of the second two electrodes, and the first wiring, the plurality of wirings, and the second wiring of even rows/even columns are connected in series between another of the first two electrodes and another of the second two electrodes.

8. The imaging element according to claim 7, wherein inspection for presence or absence of breaking of the wirings of the odd rows/odd columns is performed in between the one of the first two electrodes and the one of the second two electrodes, and the inspection for the presence or the absence of breaking of the wirings of the even rows/even columns is performed in between the another of the first two electrodes and the another of the second two electrodes.

9. The imaging element according to claim 7, wherein inspection for presence or absence of a short circuit between adjacent wirings is performed by checking whether or not a current flows between the wirings connected in series in the odd rows/odd columns and the wirings connected in series in the even rows/even columns.

10. An electronic device comprising an imaging element, the imaging element including:

a first substrate on which a pixel circuit connected to a light receiving part is formed, and a second substrate on which a pixel control part that controls the pixel circuit is formed, the first substrate and the second substrate being stacked, wherein the first substrate includes:

a first wiring formed corresponding to a first pixel row or pixel column, a second wiring formed corresponding to a second pixel row or pixel column, a first connection part that connects the first wiring and the pixel control part, a second connection part that connects the second wiring and the pixel control part, a switch part that controls connection between the first wiring and the second wiring, wherein the switch part includes a switch element, and wherein the switch element includes a transistor of same conductivity type as a conductivity type of a transistor included in a pixel, a first electrode connected to the first wiring via the switch part, and a second electrode connected to the second wiring via the switch part.

11. An imaging element comprising:

a first substrate on which a pixel circuit connected to a light receiving part is formed, and a second substrate on which a pixel control part that controls the pixel circuit is formed, the first substrate and the second substrate being stacked, wherein the first substrate includes:

a first wiring formed corresponding to a first pixel row or pixel column, a second wiring formed corresponding to a second pixel row or pixel column, a first connection part that connects the first wiring and the pixel control part, a second connection part that connects the second wiring and the pixel control part, a switch part that controls connection between the first wiring and the second wiring, wherein the switch part includes a switch element, wherein the switch element includes a transistor of a same conductivity type as a conductivity type of a transistor included in a pixel, and wherein the pixel is two dimensionally arranged in a row direction and a column direction in a matrix inside the pixel circuit, a first electrode connected to the first wiring via the switch part, and a second electrode connected to the second wiring via the switch part.

* * * * *